(12) United States Patent
Riemer et al.

(10) Patent No.: US 10,297,875 B2
(45) Date of Patent: May 21, 2019

(54) BATTERY INCLUDING AN ON-CELL INDICATOR

(71) Applicant: DURACELL U.S. OPERATIONS, INC., Wilmington, DE (US)

(72) Inventors: Joern Riemer, Danbury, CT (US); Robert John Pavlinsky, Oxford, CT (US); Mathias Amann, Darmstadt (DE)

(73) Assignee: DURACELL U.S. OPERATIONS, INC., Wilmington, DE (US)

( * ) Notice: Subject to any disclaimer, the term of this patent is extended or adjusted under 35 U.S.C. 154(b) by 603 days.

(21) Appl. No.: 14/842,245

(22) Filed: Sep. 1, 2015

(65) Prior Publication Data
US 2017/0062880 A1    Mar. 2, 2017

(51) Int. Cl.
*H01M 10/48* (2006.01)
*G01R 31/36* (2019.01)
(Continued)

(52) U.S. Cl.
CPC ........ *H01M 10/48* (2013.01); *G01R 31/3686* (2013.01); *G01R 31/3689* (2013.01);
(Continued)

(58) Field of Classification Search
CPC .... H01M 10/40; H01M 10/425; H01M 10/48; H01M 10/488
See application file for complete search history.

(56) References Cited

U.S. PATENT DOCUMENTS 3,354,565 A    11/1967    Emmons et al.
3,992,228 A    11/1976    Depoix
(Continued)

FOREIGN PATENT DOCUMENTS

CN    1084281 A    3/1994
CN    1228540 A    9/1999
(Continued)

OTHER PUBLICATIONS

Atmel Corporation, *Application Note AVR400: Low Cost A/D Converter*, available at http://www.atmel.com/images/doc0942.pdf (last visited Oct. 24, 2013).
(Continued)

*Primary Examiner* — James Lee
(74) *Attorney, Agent, or Firm* — Marshall, Gerstein & Borun LLP

(57) ABSTRACT

The invention is directed toward a battery including an on-cell indicator. The battery including an on-cell indicator includes at least one electrochemical cell; at least one on-cell indicator; a printed circuit board; and at least one integrated circuit. The at least one electrochemical cell includes a first terminal and a second terminal. The at least one on-cell indicator includes at least one on-cell indicator terminal. The printed circuit board includes at least one on-cell indicator contact and at least one electrochemical cell contact. The at least one electrochemical cell contact is in electrical connection with the first terminal of the at least one electrochemical cell. At least one conductive trace includes an on-cell indicator interconnect and a printed circuit board interconnect. The on-cell indicator interconnect is in electrical connection with the at least one on-cell indicator terminal. The printed circuit board interconnect is in electrical connection with the at least one on-cell indicator terminal. At least one integrated circuit is in electrical connection with the printed circuit board.

17 Claims, 17 Drawing Sheets

(51) Int. Cl.
*H01M 10/42* (2006.01)
*H02J 7/00* (2006.01)

(52) U.S. Cl.
CPC ....... *H01M 10/425* (2013.01); *H01M 10/488* (2013.01); *H02J 7/0047* (2013.01); *H01M 2010/4271* (2013.01); *H01M 2010/4278* (2013.01); *H01M 2220/30* (2013.01)

(56) References Cited

U.S. PATENT DOCUMENTS

| | | | |
|---|---|---|---|
| 3,993,985 | A | 11/1976 | Chopard et al. |
| 4,117,475 | A | 9/1978 | Ebihara et al. |
| 4,149,146 | A | 4/1979 | Ebihara et al. |
| 4,238,554 | A | 12/1980 | Barrella |
| 4,302,751 | A | 11/1981 | Nakauchi et al. |
| 4,460,870 | A | 7/1984 | Finger |
| 4,482,615 | A | 11/1984 | Rosansky et al. |
| 4,598,243 | A | 7/1986 | Kawakami |
| 4,654,280 | A | 3/1987 | Bailey |
| 4,759,765 | A | 7/1988 | Van Kampen |
| 4,808,497 | A | 2/1989 | Blomgren et al. |
| 4,860,185 | A | 8/1989 | Brewer et al. |
| 4,952,330 | A | 8/1990 | Leger et al. |
| 5,015,544 | A | 5/1991 | Burroughs et al. |
| 5,032,825 | A | 7/1991 | Kuznicki |
| 5,219,683 | A | 6/1993 | Webber |
| 5,231,356 | A | 7/1993 | Parker |
| 5,250,905 | A | 10/1993 | Kuo et al. |
| 5,290,414 | A | 3/1994 | Marple |
| 5,339,024 | A | 8/1994 | Kuo et al. |
| 5,355,089 | A | 10/1994 | Treger |
| 5,366,832 | A | 11/1994 | Hayashi et al. |
| 5,389,458 | A | 2/1995 | Weiss et al. |
| 5,389,470 | A | 2/1995 | Parker et al. |
| 5,396,177 | A | 3/1995 | Kuo et al. |
| 5,418,086 | A | 5/1995 | Bailey |
| 5,424,722 | A | 6/1995 | Inada et al. |
| 5,438,607 | A | 8/1995 | Przygoda, Jr. et al. |
| 5,458,992 | A | 10/1995 | Bailey |
| 5,458,997 | A | 10/1995 | Crespi et al. |
| 5,491,038 | A | 2/1996 | DePalma et al. |
| 5,494,496 | A | 2/1996 | Huhndorff et al. |
| 5,514,491 | A | 5/1996 | Webber |
| 5,525,439 | A | 6/1996 | Huhndorff et al. |
| 5,543,246 | A | 8/1996 | Treger |
| 5,569,556 | A | 10/1996 | Bohmer |
| 5,587,573 | A | 12/1996 | Owen et al. |
| 5,596,278 | A | 1/1997 | Lin |
| 5,607,790 | A | 3/1997 | Hughen et al. |
| 5,627,472 | A | 5/1997 | Ofer et al. |
| 5,633,592 | A | 5/1997 | Lang |
| 5,640,150 | A | 6/1997 | Atwater |
| 5,691,083 | A | 11/1997 | Bolster |
| 5,737,114 | A | 4/1998 | Bailey |
| 5,786,106 | A | 7/1998 | Armani |
| 5,798,933 | A | 8/1998 | Nicolai |
| 5,849,046 | A | 12/1998 | Bailey |
| 5,925,479 | A | 7/1999 | Wei et al. |
| 5,959,568 | A | 9/1999 | Woolley |
| 5,963,012 | A | 10/1999 | Garcia et al. |
| 6,014,014 | A | 1/2000 | Owen et al. |
| 6,084,523 | A | 7/2000 | Gelnovatch et al. |
| 6,127,062 | A | 10/2000 | Sargeant et al. |
| 6,143,439 | A | 11/2000 | Yoppolo et al. |
| 6,156,450 | A | 12/2000 | Bailey |
| 6,169,397 | B1 | 1/2001 | Steinbach et al. |
| 6,171,729 | B1 | 1/2001 | Gan et al. |
| 6,208,235 | B1 | 3/2001 | Trontelj |
| 6,218,054 | B1 | 4/2001 | Webber |
| 6,252,377 | B1 | 6/2001 | Shibutani et al. |
| 6,275,161 | B1 | 8/2001 | Wan et al. |
| 6,300,004 | B1 | 10/2001 | Tucholski |
| 6,407,534 | B1 | 6/2002 | Mukainakano |
| 6,469,471 | B1 | 10/2002 | Anbuky et al. |
| 6,483,275 | B1 * | 11/2002 | Nebrigic ............ G01R 31/3648 320/107 |
| 6,587,250 | B2 | 7/2003 | Armgarth et al. |
| 6,617,069 | B1 | 9/2003 | Hopper et al. |
| 6,617,072 | B2 | 9/2003 | Venkatesan et al. |
| 6,627,353 | B1 | 9/2003 | Munshi |
| 6,670,073 | B2 | 12/2003 | Tucholski et al. |
| RE38,518 | E | 5/2004 | Tucholski |
| 6,730,136 | B2 | 5/2004 | Webber |
| 6,774,685 | B2 | 8/2004 | O'Toole et al. |
| 6,775,562 | B1 | 8/2004 | Owens et al. |
| 6,849,360 | B2 | 2/2005 | Marple |
| 6,979,502 | B1 | 12/2005 | Gartstein et al. |
| 7,067,882 | B2 | 6/2006 | Singh |
| 7,079,079 | B2 | 7/2006 | Jo et al. |
| 7,157,185 | B2 | 1/2007 | Marple |
| 7,386,404 | B2 | 6/2008 | Cargonja et al. |
| 7,474,230 | B2 | 1/2009 | Blom et al. |
| 7,489,431 | B2 | 2/2009 | Malmstrom et al. |
| 7,511,454 | B1 | 3/2009 | Legg |
| 7,561,050 | B2 | 7/2009 | Bhogal et al. |
| 7,576,517 | B1 | 8/2009 | Cotton et al. |
| 7,586,416 | B2 | 9/2009 | Ariyoshi et al. |
| 7,598,880 | B2 | 10/2009 | Powell et al. |
| 7,606,530 | B1 | 10/2009 | Anderson et al. |
| 7,715,884 | B2 | 5/2010 | Book et al. |
| 7,741,970 | B2 | 6/2010 | Cunningham et al. |
| 7,745,046 | B2 | 6/2010 | Kim et al. |
| 7,768,236 | B2 | 8/2010 | Takamura et al. |
| 7,772,850 | B2 | 8/2010 | Bertness |
| 7,805,263 | B2 | 9/2010 | Mack |
| 7,911,182 | B2 | 3/2011 | Cargonja et al. |
| 7,944,368 | B2 | 5/2011 | Carter et al. |
| 8,031,054 | B2 | 10/2011 | Tuttle |
| 8,106,845 | B2 | 1/2012 | Savry |
| 8,119,286 | B2 | 2/2012 | Issaev et al. |
| 8,131,486 | B2 | 3/2012 | Leonard et al. |
| 8,344,685 | B2 | 1/2013 | Bertness et al. |
| 8,368,356 | B2 | 2/2013 | Nakashima et al. |
| 8,424,092 | B2 | 4/2013 | Ikeuchi et al. |
| 8,427,109 | B2 | 4/2013 | Melichar |
| 8,471,888 | B2 | 6/2013 | George et al. |
| 8,652,670 | B2 | 2/2014 | Uchida |
| 8,653,926 | B2 | 2/2014 | Detcheverry et al. |
| 8,900,731 | B2 | 12/2014 | Bohne |
| 8,905,317 | B1 | 12/2014 | Hsu et al. |
| 9,037,426 | B2 | 5/2015 | Schaefer |
| 9,060,213 | B2 | 6/2015 | Jones |
| 9,076,092 | B2 | 7/2015 | Ritamaki et al. |
| 9,083,063 | B2 | 7/2015 | Specht et al. |
| 9,146,595 | B2 | 9/2015 | Forutanpour et al. |
| 9,167,317 | B2 | 10/2015 | DeMar |
| 9,189,667 | B2 | 11/2015 | Bourilkov et al. |
| 9,235,044 | B2 | 1/2016 | Specht et al. |
| 9,297,859 | B2 | 3/2016 | Mukaitani et al. |
| 9,312,575 | B2 | 4/2016 | Stukenberg et al. |
| 9,331,378 | B2 | 5/2016 | Merlin et al. |
| 9,453,885 | B2 | 9/2016 | Mukaitani et al. |
| 9,459,323 | B2 | 10/2016 | Mukaitani et al. |
| 9,461,339 | B2 | 10/2016 | Roohparvar |
| 9,478,850 | B2 | 10/2016 | Bourilkov et al. |
| 9,551,758 | B2 | 1/2017 | Bourilkov et al. |
| 9,568,556 | B2 | 2/2017 | Bourilkov et al. |
| 9,619,612 | B2 | 4/2017 | Kallfelz et al. |
| 9,639,724 | B2 | 5/2017 | Bourilkov et al. |
| 9,661,576 | B2 | 5/2017 | Tomisawa |
| 9,699,818 | B2 | 7/2017 | Grothaus et al. |
| 9,726,763 | B2 | 8/2017 | Dempsey et al. |
| 9,739,837 | B2 | 8/2017 | Bourilkov et al. |
| 9,746,524 | B2 | 8/2017 | Petrucelli |
| 9,823,310 | B2 | 11/2017 | Bourilkov et al. |
| 9,841,462 | B2 | 12/2017 | Kim et al. |
| 9,843,220 | B2 | 12/2017 | Herrmann et al. |
| 9,869,726 | B2 | 1/2018 | Zumstein et al. |
| 9,882,250 | B2 | 1/2018 | Chappelle et al. |
| 9,887,463 | B2 | 2/2018 | Bourilkov et al. |
| 9,893,390 | B2 | 2/2018 | Specht et al. |
| 9,983,312 | B2 | 5/2018 | Dempsey et al. |
| 2001/0005123 | A1 | 6/2001 | Jones et al. |

(56) References Cited

U.S. PATENT DOCUMENTS

| | | |
|---|---|---|
| 2001/0026226 A1 | 10/2001 | Andersson et al. |
| 2002/0001745 A1 | 1/2002 | Gartstein et al. |
| 2002/0086718 A1 | 7/2002 | Bigwood et al. |
| 2003/0070283 A1 | 4/2003 | Webber |
| 2003/0169047 A1 | 9/2003 | Chen |
| 2003/0170537 A1 | 9/2003 | Randell |
| 2003/0184493 A1 | 10/2003 | Robinet et al. |
| 2003/0228518 A1 | 12/2003 | Marple |
| 2004/0029007 A1 | 2/2004 | Kusumoto et al. |
| 2004/0048512 A1 | 3/2004 | Chen |
| 2004/0183742 A1 | 9/2004 | Goff et al. |
| 2005/0038614 A1 | 2/2005 | Botts et al. |
| 2005/0073282 A1 | 4/2005 | Carrier et al. |
| 2005/0095508 A1 | 5/2005 | Yamamoto |
| 2005/0112462 A1 | 5/2005 | Marple |
| 2005/0162129 A1 | 7/2005 | Mutabdzija et al. |
| 2005/0233214 A1 | 10/2005 | Marple et al. |
| 2005/0277023 A1 | 12/2005 | Marple et al. |
| 2006/0017581 A1 | 1/2006 | Schwendinger et al. |
| 2006/0043933 A1 | 3/2006 | Latinis |
| 2006/0046152 A1 | 3/2006 | Webber |
| 2006/0046153 A1 | 3/2006 | Webber |
| 2006/0046154 A1 | 3/2006 | Webber et al. |
| 2006/0047576 A1 | 3/2006 | Aaltonen et al. |
| 2006/0163692 A1 | 7/2006 | Detcheverry et al. |
| 2006/0168802 A1 | 8/2006 | Tuttle |
| 2006/0170397 A1 | 8/2006 | Srinivasan et al. |
| 2006/0208898 A1 | 9/2006 | Swanson et al. |
| 2006/0247156 A1 | 11/2006 | Vanderby et al. |
| 2006/0261960 A1 | 11/2006 | Haraguchi et al. |
| 2007/0080804 A1 | 4/2007 | Hirahara et al. |
| 2007/0096697 A1 | 5/2007 | Maireanu |
| 2007/0108946 A1 | 5/2007 | Yamauchi et al. |
| 2007/0182576 A1 | 8/2007 | Proska et al. |
| 2007/0210924 A1 | 9/2007 | Arnold et al. |
| 2007/0273329 A1 | 11/2007 | Kobuse et al. |
| 2008/0053716 A1 | 3/2008 | Scheucher |
| 2008/0076029 A1 | 3/2008 | Bowden et al. |
| 2008/0079391 A1 | 4/2008 | Schroeck et al. |
| 2008/0157924 A1 | 7/2008 | Batra |
| 2008/0160392 A1* | 7/2008 | Toya ............... H01M 2/027 429/90 |
| 2008/0206627 A1 | 8/2008 | Wright |
| 2008/0252462 A1 | 10/2008 | Sakama |
| 2009/0008031 A1 | 1/2009 | Gould et al. |
| 2009/0009177 A1 | 1/2009 | Kim et al. |
| 2009/0024309 A1 | 1/2009 | Crucs |
| 2009/0041228 A1 | 2/2009 | Owens et al. |
| 2009/0098462 A1 | 4/2009 | Fujiwara et al. |
| 2009/0148756 A1 | 6/2009 | Specht et al. |
| 2009/0155673 A1 | 6/2009 | Northcott |
| 2009/0179763 A1 | 7/2009 | Sheng |
| 2009/0214950 A1 | 8/2009 | Bowden et al. |
| 2009/0263727 A1 | 10/2009 | Josephs et al. |
| 2009/0273473 A1 | 11/2009 | Tuttle |
| 2009/0289825 A1 | 11/2009 | Trinkle |
| 2009/0297949 A1 | 12/2009 | Berkowitz et al. |
| 2010/0019733 A1 | 1/2010 | Rubio |
| 2010/0081049 A1 | 4/2010 | Holl et al. |
| 2010/0085008 A1 | 4/2010 | Suzuki et al. |
| 2010/0087241 A1 | 4/2010 | Nguyen et al. |
| 2010/0143753 A1 | 6/2010 | Kim et al. |
| 2010/0209744 A1 | 8/2010 | Kim |
| 2010/0219252 A1 | 9/2010 | Kikuchi et al. |
| 2010/0295943 A1 | 11/2010 | Cha et al. |
| 2010/0308974 A1 | 12/2010 | Rowland et al. |
| 2011/0023130 A1 | 1/2011 | Gudgel et al. |
| 2011/0104520 A1 | 5/2011 | Ahn |
| 2011/0123874 A1 | 5/2011 | Issaev et al. |
| 2011/0163752 A1 | 7/2011 | Janousek et al. |
| 2011/0293969 A1 | 12/2011 | Hoofman et al. |
| 2012/0021266 A1 | 1/2012 | Marple et al. |
| 2012/0056002 A1 | 3/2012 | Ritamaki et al. |
| 2012/0081774 A1 | 4/2012 | De Paiva Martins et al. |
| 2012/0086615 A1 | 4/2012 | Norair |
| 2012/0121943 A1 | 5/2012 | Roohparvar |
| 2012/0183862 A1 | 7/2012 | Gupta et al. |
| 2012/0190305 A1 | 7/2012 | Wuidart |
| 2012/0206102 A1 | 8/2012 | Okamura et al. |
| 2012/0206302 A1 | 8/2012 | Ramachandran et al. |
| 2012/0217971 A1 | 8/2012 | Deluca |
| 2012/0235870 A1 | 9/2012 | Forster |
| 2012/0277832 A1 | 11/2012 | Hussain |
| 2012/0299597 A1 | 11/2012 | Shigemizu |
| 2012/0323511 A1 | 12/2012 | Saigo et al. |
| 2013/0069768 A1 | 3/2013 | Madhyastha et al. |
| 2013/0127611 A1 | 5/2013 | Bernstein et al. |
| 2013/0148283 A1 | 6/2013 | Forutanpour et al. |
| 2013/0154652 A1 | 6/2013 | Rice et al. |
| 2013/0161380 A1 | 6/2013 | Joyce et al. |
| 2013/0162402 A1 | 6/2013 | Amann et al. |
| 2013/0162403 A1 | 6/2013 | Striemer et al. |
| 2013/0162404 A1 | 6/2013 | Striemer et al. |
| 2013/0164567 A1 | 6/2013 | Olsson et al. |
| 2013/0183568 A1 | 7/2013 | Babinec et al. |
| 2013/0185008 A1 | 7/2013 | Itabashi et al. |
| 2013/0271072 A1 | 10/2013 | Lee et al. |
| 2013/0295421 A1* | 11/2013 | Teramoto ............... H01M 10/02 429/61 |
| 2013/0320989 A1 | 12/2013 | Inoue et al. |
| 2014/0062663 A1 | 3/2014 | Bourilkov et al. |
| 2014/0139380 A1 | 5/2014 | Ouyang et al. |
| 2014/0188413 A1 | 7/2014 | Bourilkov et al. |
| 2014/0229129 A1 | 8/2014 | Campbell et al. |
| 2014/0302348 A1 | 10/2014 | Specht et al. |
| 2014/0302351 A1* | 10/2014 | Specht ............... H01M 10/4257 429/7 |
| 2014/0320144 A1 | 10/2014 | Nakaya |
| 2014/0342193 A1 | 11/2014 | Mull et al. |
| 2014/0346873 A1 | 11/2014 | Colangelo et al. |
| 2014/0347249 A1 | 11/2014 | Bourilkov et al. |
| 2014/0370344 A1 | 12/2014 | Lovelace et al. |
| 2014/0379285 A1 | 12/2014 | Dempsey et al. |
| 2015/0061603 A1 | 3/2015 | Loftus et al. |
| 2015/0064524 A1 | 3/2015 | Noh et al. |
| 2015/0349391 A1 | 12/2015 | Chappelle et al. |
| 2016/0034733 A1 | 2/2016 | Bourilkov et al. |
| 2016/0049695 A1 | 2/2016 | Lim et al. |
| 2016/0064781 A1 | 3/2016 | Specht et al. |
| 2016/0092847 A1 | 3/2016 | Buchbinder |
| 2016/0137088 A1 | 5/2016 | Lim et al. |
| 2016/0277879 A1 | 9/2016 | Daoura et al. |
| 2017/0040698 A1 | 2/2017 | Bourilkov et al. |
| 2017/0062841 A1 | 3/2017 | Riemer et al. |
| 2017/0062880 A1 | 3/2017 | Riemer et al. |
| 2017/0092994 A1 | 3/2017 | Canfield et al. |
| 2017/0125855 A1 | 5/2017 | Gong et al. |
| 2017/0176539 A1 | 6/2017 | Younger |
| 2017/0286918 A1 | 10/2017 | Westermann et al. |
| 2017/0301961 A1 | 10/2017 | Kim et al. |
| 2017/0315183 A1 | 11/2017 | Chao et al. |
| 2017/0331162 A1 | 11/2017 | Clarke et al. |
| 2018/0040929 A1 | 2/2018 | Chappelle et al. |
| 2018/0088182 A1 | 3/2018 | Bourilkov et al. |
| 2018/0120386 A1 | 5/2018 | Riemer et al. |
| 2018/0123174 A1 | 5/2018 | Riemer et al. |
| 2018/0123175 A1 | 5/2018 | Riemer et al. |
| 2018/0123176 A1 | 5/2018 | Riemer et al. |
| 2018/0123233 A1 | 5/2018 | Bourilkov et al. |

FOREIGN PATENT DOCUMENTS

| | | |
|---|---|---|
| CN | 1315072 A | 9/2001 |
| CN | 2828963 Y | 10/2006 |
| CN | 101126795 A | 2/2008 |
| CN | 201142022 Y | 10/2008 |
| CN | 101702792 A | 5/2010 |
| CN | 101785164 A | 7/2010 |
| CN | 102097844 A | 6/2011 |
| CN | 102142186 A | 8/2011 |
| CN | 102544709 A | 7/2012 |
| CN | 202720320 U | 2/2013 |
| CN | 103682482 A | 3/2014 |
| CN | 104635169 A | 5/2015 |

(56) References Cited

FOREIGN PATENT DOCUMENTS

| | | | |
|---|---|---|---|
| CN | 105337367 | A | 2/2016 |
| CN | 205160145 | U | 4/2016 |
| CN | 106405241 | A | 2/2017 |
| CN | 106848448 | A | 6/2017 |
| CN | 107284272 | A | 10/2017 |
| CN | 206804833 | U | 12/2017 |
| DE | 10118027 | A1 | 11/2002 |
| DE | 10118051 | A1 | 11/2002 |
| EP | 0523901 | A1 | 1/1993 |
| EP | 1450174 | A1 | 8/2004 |
| EP | 1693807 | A1 | 8/2006 |
| EP | 1786057 | A2 | 5/2007 |
| EP | 1821363 | A1 | 8/2007 |
| EP | 2065962 | A1 | 6/2009 |
| EP | 2204873 | A1 | 7/2010 |
| EP | 2324535 | A1 | 5/2011 |
| EP | 2328223 | A1 | 6/2011 |
| EP | 2645447 | A1 | 10/2013 |
| EP | 2680093 | A2 | 1/2014 |
| EP | 2790262 | A1 | 10/2014 |
| EP | 3128599 | A1 | 2/2017 |
| JP | S52005581 | A | 1/1977 |
| JP | 61169781 | | 7/1986 |
| JP | 02142324 | | 5/1990 |
| JP | H03131771 | A | 6/1991 |
| JP | H09005366 | A | 1/1997 |
| JP | 10014003 | | 1/1998 |
| JP | 2000077928 | A | 3/2000 |
| JP | 2001022905 | A | 1/2001 |
| JP | 2004085580 | A | 3/2004 |
| JP | 2004-253858 | | 9/2004 |
| JP | 2004534430 | A | 11/2004 |
| JP | 2005327099 | A | 11/2005 |
| JP | 2006139544 | A | 6/2006 |
| JP | 2006284431 | A | 10/2006 |
| JP | 2006324074 | A | 11/2006 |
| JP | 2007515848 | A | 6/2007 |
| JP | 2007171045 | A | 7/2007 |
| JP | 2008042985 | A | 2/2008 |
| JP | 2008-530682 | A | 8/2008 |
| JP | 2009-37374 | | 2/2009 |
| JP | 2010098361 | A | 4/2010 |
| JP | 2010-154012 | A | 7/2010 |
| JP | 2011113759 | A | 6/2011 |
| JP | 2011203595 | A | 10/2011 |
| JP | 2012085491 | A | 4/2012 |
| JP | 2012161614 | A | 8/2012 |
| JP | 2012170262 | A | 9/2012 |
| JP | 2013038961 | A | 2/2013 |
| JP | 2013120640 | A | 6/2013 |
| KR | 2011-0018488 | A | 2/2011 |
| TW | M510009 | U | 10/2015 |
| TW | I580153 | B | 4/2017 |
| WO | WO-95/01062 | A1 | 1/1995 |
| WO | WO-03/047064 | A2 | 6/2003 |
| WO | WO-2004/107251 | A2 | 12/2004 |
| WO | WO-2005/078673 | A1 | 8/2005 |
| WO | WO-2006/048838 | A1 | 5/2006 |
| WO | WO-2006/085291 | A2 | 8/2006 |
| WO | WO-2008/151181 | A1 | 12/2008 |
| WO | WO-2008/156735 | A1 | 12/2008 |
| WO | WO-2010/127509 | A1 | 11/2010 |
| WO | WO-2011/063679 | A1 | 6/2011 |
| WO | WO-2011/096863 | A1 | 8/2011 |
| WO | WO-2012/051272 | A2 | 4/2012 |
| WO | WO-2012/061262 | A1 | 5/2012 |
| WO | WO-2012/070635 | A1 | 5/2012 |
| WO | WO-2012/083759 | A1 | 6/2012 |
| WO | WO-2013/022857 | A2 | 2/2013 |
| WO | WO-2013/024341 | A1 | 2/2013 |
| WO | WO-2013/069423 | A1 | 5/2013 |
| WO | WO-2013/084481 | A1 | 6/2013 |
| WO | WO-2013/101652 | A1 | 7/2013 |
| WO | WO-2015/183609 | A1 | 12/2015 |
| WO | WO-2016/146006 | A1 | 9/2016 |
| WO | WO-2016/166735 | A1 | 10/2016 |
| WO | WO-2016/172542 | A1 | 10/2016 |

OTHER PUBLICATIONS

Kooser, Tethercell magically turns AA batteries into Bluetooth devices, CNET.com, downloaded from the Internet at: <https://www.cnet.com/news/tethercell-magically-turns-aa-batteries-into-bluetooth-devices/> (Jan. 8, 2013).

Tethercell Smart Battery Adapter fundraising campaign on Indiegogo website (<https://www.indiegogo.com/projects/tethercell-smart-battery-adapter#/>) (launched Oct. 2013).

Tethercell video uploaded at <https://vimeo.com/53823785> (Oct. 2012).

Yamashiro, Voltage Detecting Circuit, Japanese Patent No. 52005581, Hitashi Ltd., (Jan. 17, 1977), Translated by the United States Patent and Trademark Office via Phoenix Translations (Elgin, TX) in Feb. 2018.

* cited by examiner

BATTERY INCLUDING AN ON-CELL INDICATOR

FIELD OF THE INVENTION

The invention relates to a battery including an on-cell indicator.

BACKGROUND OF THE INVENTION

Wireless communications, including radio frequency identification (RFID) and other near field communication (NFC) protocols, are gaining in popularity for applications such as security, inventory management, access control, and the like. The number of smartphones and mobile devices that include RFID or NFC protocols is growing along with the various applications of passive or active transponders, such as RFID circuits and NFC circuits. Such communications circuits may be coupled with an antenna that modulates, and in some instances emits, a wireless communication signal that can be read by a reader, such as a smartphone.

Electrochemical cells, or batteries, are commonly used as electrical energy sources. A battery contains a negative electrode and a positive electrode. The negative electrode contains an active material that can be oxidized. The positive electrode contains an active material that can be reduced. The negative active material is capable of reducing the positive active material. A separator is disposed between the negative electrode and the positive electrode. An electrolyte is also included within the battery. The aforementioned components are generally disposed in a housing, such as a metal can with an open end, that is crimped over an end cap and seal to close the battery. The battery may be primary, i.e., meant to be discharged to exhaustion one time and then discarded. The battery may, alternatively, be secondary, i.e., meant to be discharged and recharged multiple times.

Battery testers may be used to determine characteristics of the battery, such as the remaining battery capacity. An exemplary type of a common battery tester is known as a thermochromic tester. In a thermochromic tester, a circuit may be completed when a consumer manually depresses a one or two button switch. Once the switch is depressed, the consumer has connected the battery to the thermochromic tester. The thermochromic tester may include a silver resistor, e.g., a flat silver layer that has a variable width so that the electrical resistance also varies along its length. As current travels through the silver resistor, the dissipated power generates heat that changes the color of a thermochromic ink display that is placed over the silver resistor. The thermochromic ink display may be arranged as a gauge to indicate the relative capacity of the battery. However, it is typically necessary for the consumer to inconveniently hold the battery and/or remove the battery from the device in order to test the battery using the battery tester, such as the thermochromic tester. In addition, in may be difficult to accurately connect the battery tester to the battery.

Accordingly, there exists a need for a battery including an on-cell indicator that does not require manual interaction between the consumer and the battery and/or indicator. In addition, the battery including an on-cell indicator may also include advanced processing and communication capabilities. There also exists a need for a battery including an indicator circuit that does not detrimentally affect the external dimensions of the battery. A need exists to provide an on-cell indicator that easily connects to the battery. There also exists a need to provide a battery with an on-cell indicator that does not have a reduced battery capacity due to the inclusion of on-cell indicator components within the battery housing.

SUMMARY OF THE INVENTION

In one embodiment, the invention is directed toward a battery including an on-cell indicator. The battery including an on-cell indicator includes at least one electrochemical cell; at least one on-cell indicator; a printed circuit board; and at least one integrated circuit. The at least one electrochemical cell includes a first terminal and a second terminal. The at least one on-cell indicator includes at least one on-cell indicator terminal. The printed circuit board includes at least one on-cell indicator contact and at least one electrochemical cell contact. The at least one electrochemical cell contact is in electrical connection with the first terminal of the at least one electrochemical cell. At least one conductive trace includes an on-cell indicator interconnect and a printed circuit board interconnect. The on-cell indicator interconnect is in electrical connection with the at least one on-cell indicator terminal. The printed circuit board interconnect is in electrical connection with the at least one on-cell indicator terminal. The at least one integrated circuit is in electrical connection with the printed circuit board.

In another embodiment, the invention is directed toward a remote battery indication system. The remote battery system includes at least one reader and at least one battery including an on-cell indicator. The at least one reader may be, for example, a smartphone. The at least one battery including an on-cell indicator includes at least one electrochemical cell; at least one on-cell indicator; a printed circuit board; a communications circuit; and at least one integrated circuit. The at least one electrochemical cell includes a first terminal and a second terminal. The at least one on-cell indicator includes at least one on-cell indicator terminal. The printed circuit board includes at least one on-cell indicator contact and at least one electrochemical cell contact. The at least one electrochemical cell contact is in electrical connection with the first terminal of the at least one electrochemical cell. At least one conductive trace includes an on-cell indicator interconnect and a printed circuit board interconnect. The on-cell indicator interconnect is in electrical connection with the at least one on-cell indicator terminal. The printed circuit board interconnect is in electrical connection with the at least one on-cell indicator terminal. The at least one integrated circuit is in electrical connection with the printed circuit board.

BRIEF DESCRIPTION OF THE DRAWINGS

While the specification concludes with claims particularly pointing out and distinctly claiming the subject matter, which is regarded as forming the present invention, it is believed that the invention will be better understood from the following description taken in conjunction with the accompanying drawings.

DETAILED DESCRIPTION OF THE INVENTION

Figure 1:
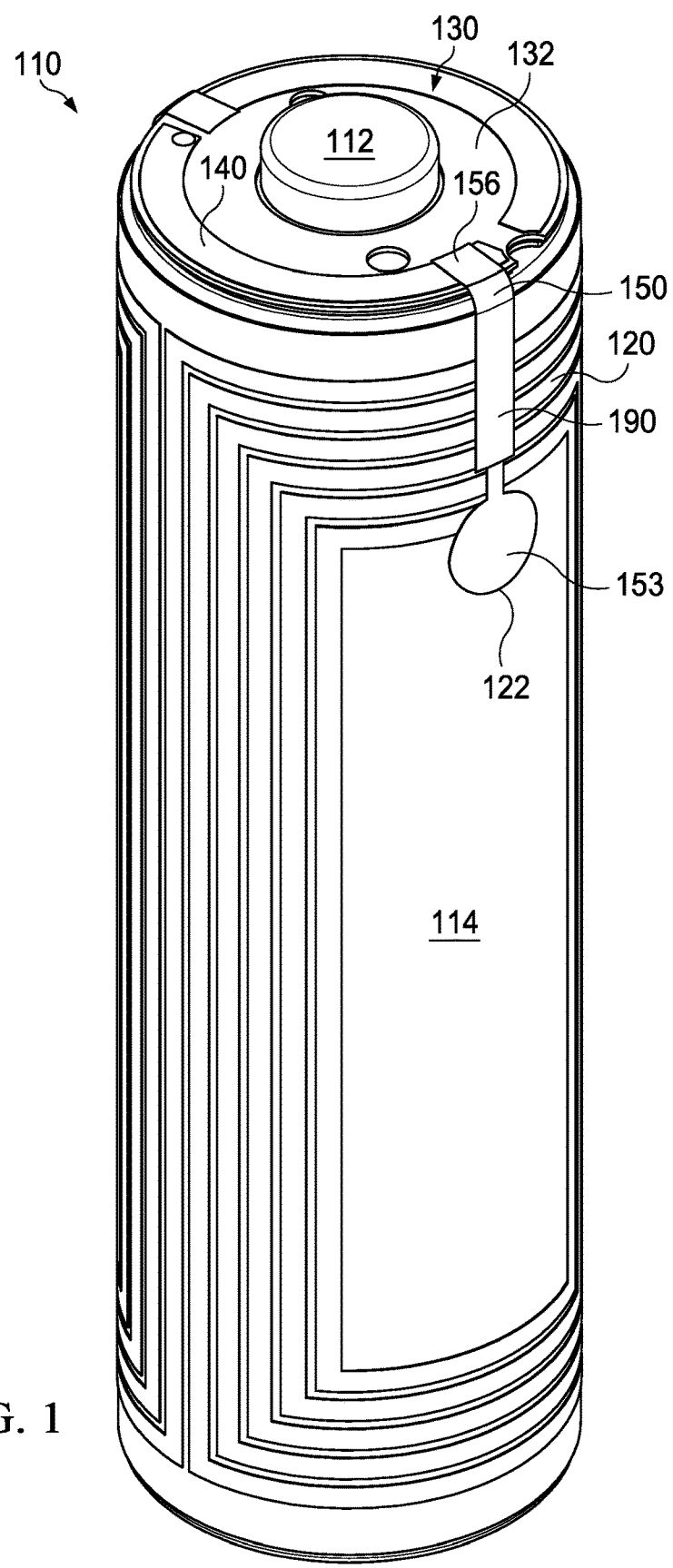
FIG. 1 is a perspective view of a battery including an on-cell indicator according to one or more embodiments shown and described herein.

The present invention is directed toward a battery including an on-cell indicator. The battery including an on-cell indicator may include at least one electrochemical cell; at least one on-cell indicator; at least one printed circuit board (PCB); and at least one integrated circuit. The electrochemical cell may include a first terminal and a second terminal. The PCB may be in electrical connection with, at least, the first terminal of the electrochemical cell. The on-cell indicator may be in electrical connection with the PCB. The at least one IC may be in electrical connection with the PCB. The at least one IC may be in electrical connection with the at least one on-cell indicator. The battery including an on-cell indicator is capable of, for example, sending information, such as battery voltage, to a reader, such as a smartphone.

The electrochemical cell is capable of converting chemical energy within the active materials of the electrochemical cell by means of an electrochemical reduction-oxidation (redox) reaction to electrical energy. David Linden, *Handbook of Batteries*, 1.3 ($4^{th}$ ed. 2011). The electrochemical cell consists of an anode, a cathode, and an electrolyte. Id. One or more electrochemical cells may be referred to as a battery. Electrochemical cells, or batteries, may be primary or secondary. Primary batteries are meant to be discharged, e.g., to exhaustion, only once and then discarded. Primary batteries are described, for example, in David Linden, *Handbook of Batteries* ($4^{th}$ ed. 2011). Secondary batteries are intended to be recharged. Secondary batteries may be discharged and recharged multiple times, e.g., fifty times, a hundred times, or more. Secondary batteries are described, for example, in David Linden, *Handbook of Batteries* ($4^{th}$ ed. 2011). Accordingly, batteries may include various electrochemical couples and electrolyte combinations. It should be appreciated that the invention applies to primary and secondary batteries of aqueous, nonaqueous, ionic liquid, and solid state systems. Primary and secondary batteries of the aforementioned systems are thus within the scope of this application and the invention is not limited to any particular embodiment.

Batteries also come in varying sizes and dimensions. The International Electrotechnical Commission (IEC), for example, has established standard sizes and dimensions for batteries available to consumers at retail. The IEC has set standard sizes and dimensions, for example, cylindrical batteries, such as AAA batteries, AA batteries, C batteries, and D batteries. Similarly, standard sizes and dimensions have been set for non-cylindrical batteries. A 9V alkaline battery, for example, has a prismatic, or rectangular, shape having dimensions set by the IEC. Individual battery or device manufacturers may also designate the dimensions for prismatic batteries that may not be generally available at retail, such as lithium ion prismatic batteries. It should be appreciated that the present invention applies to batteries of sizes and dimensions set by the IEC, such as AA, AAA, C, D, and 9V, as well as to batteries of sizes and dimensions designated by individual battery or device manufacturers. Primary and secondary batteries of the aforementioned sizes and dimensions are thus within the scope of this application and the invention is not limited to any particular embodiment.

The battery may have a first terminal and a second terminal. The first terminal of a primary battery may be, for example, the negative terminal. The second terminal of a primary battery may be, for example, the positive terminal. The first terminal of a secondary battery may be, for example, the positive terminal. The second terminal of a secondary battery may be, for example, the negative terminal. The battery may include a housing, such as a metal can, with at least one open end. The anode, cathode, and electrolyte may be placed within the housing. The first terminal may be an end cap. The housing may be crimped over the end cap, including a seal, to close the battery. The housing may be the second terminal of the battery.

The on-cell indicator may include an antenna. The on-cell indicator may include at least one on-cell indicator terminal. The on-cell indicator may include a first on-cell indicator terminal and a second on-cell indicator terminal. The at least one on-cell indicator terminal; the first on-cell indicator; and the second on-cell indicator terminal may comprise any suitable material, such as an electrically conductive material.

The antenna may include at least one antenna trace that may define a single antenna; multiple antennae; or define one or more continuous loop antennas. Each loop may have one or more turns or windings of the at least one antenna trace. The at least one antenna may include at least one on-cell indicator terminal. The at least one antenna may include a first on-cell indicator terminal and a second on-cell indicator terminal. The at least one on-cell indicator terminal; the first on-cell indicator terminal; and the second on-cell indicator terminal may provide joint connections for solder, conductive adhesive, conductive fluid, ultrasonic welding, thermosonic bonding, thermo-compression bonding, crimping, or compression to a conductive trace. The at least one on-cell indicator terminal; the first on-cell indicator terminal; and the second on-cell indicator terminal may be electrically coupled to the printed circuit board.

The at least one antenna; the on-cell indicator terminal; the first on-cell indicator terminal; and the second on-cell indicator terminal may be made from copper, aluminum, silver, gold, or other conductive metals. Other suitable materials include conductive foams, conductive polymers, conductive glues, and conductive carbon, such as graphite. The at least one antenna; the on-cell indicator terminal; the first on-cell indicator terminal; and the second on-cell indicator terminal may be printed, painted, or spray coated. The at least one antenna may be printed by a machine that defines the antenna through the use of screen, gravure, or ink jet printing to apply the material onto a subject surface. The printing may be completed via RF sputtering techniques; impact or pressure techniques that define material on the subject surface; metal foil mask techniques; etch techniques; chemical vapor deposition techniques; electroplating techniques; and heat or light activation techniques that activate the material that is applied to the subject surface.

The at least one antenna; the on-cell indicator terminal; the first on-cell indicator terminal; and the second on-cell indicator terminal may be made from foil. The at least one antenna; the on-cell indicator terminal; the first on-cell indicator terminal; and the second on-cell indicator terminal may be a pre-formed wire that is either insulated or bare. If the pre-formed wire is bare, it may be covered by a non-conductive sheet, a non-conductive tape, a non-conductive flexible substrate, or a non-conductive shrink wrap.

The printed circuit board includes at least one layer having an electrical circuit that is in electrical connection with the battery. A wiring pattern, or circuit, may be on or within the printed circuit board. The circuit may include a plurality of safety devices, power terminals, external connection terminals, and the like that provide additional functionality. Examples of additional functionality include a communication circuit(s), antenna(e), and thermal heat sink(s). Examples of safety devices may include a protective module, a positive-temperature-coefficient (PTC) thermistor, and the like. The protective module may include, for example, a switching device, a control-circuit unit, a resistor, an inductor, a capacitor and the like. The PCB may comprise one or more layers, each having its own wiring pattern. The wiring pattern may comprise conductive traces or conductive foil traces. A multi-layer PCB may comprise vias between layers to provide electrical connection between the wiring patterns on each respective layer. The conductive traces may be applied to the printed circuit board by any suitable means known in the art, for example, using plating, physical vapor deposition, etching, and the like.

The printed circuit board may include a top surface, a bottom surface, and a side surface. The top surface, the bottom surface, and the side surface of the printed circuit board may include at least one on-cell indicator terminal contact. The top surface, the bottom surface, and the side surface of the printed circuit board may include a first on-cell indicator terminal contact and a second on-cell indicator terminal contact. The at least one on-cell indicator terminal contact; the first on-cell indicator terminal contact; and the second on-cell indicator terminal contact may be made from copper, aluminum, silver, gold, or other conductive metals. Other suitable materials include conductive foams, conductive polymers, conductive glues, and conductive carbon, such as graphite.

The at least one on-cell indicator terminal contact; the first on-cell indicator terminal contact; and the second on-cell indicator terminal contact may, for example, include two distinct contacts. One distinct contact may be on the bottom surface of the printed circuit board. The other distinct contact may be on the top surface of the printed circuit board. The distinct contacts of the at least one on-cell indicator terminal contact; the first on-cell indicator terminal contact; and the second on-cell indicator terminal contact may be in electrical connection with one another through the wiring of the printed circuit board.

The at least one on-cell indicator terminal contact; the first on-cell indicator terminal contact; and the second on-cell indicator terminal contact may, for example, include three distinct contacts. One distinct contact may be on the bottom surface of the printed circuit board. Another distinct contact may be on the top surface of the printed circuit board. The other distinct contact may be on the side of the printed circuit board. Any one of the distinct contacts on the top, bottom, or side surfaces of the printed circuit board may be in electrical connection with one or more of the distinct contacts on the top, the bottom, or side surfaces of the printed circuit board through the wiring on or within the printed circuit board.

The printed circuit board may include a top surface, a bottom surface, and a side surface. The top surface, the bottom surface, and the side surface of the printed circuit board may include at least one electrochemical cell contact. The top surface, the bottom surface, and the side surface of the printed circuit board may include a first electrochemical cell contact and a second electrochemical cell contact. The at least one electrochemical cell contact; the first electrochemical cell contact; and the second electrochemical cell contact may be copper, aluminum, silver, gold, or other conductive metals. Other suitable materials include conductive foams, conductive polymers, conductive glues, and conductive carbon, such as graphite.

The at least one electrochemical cell contact; the first electrochemical cell contact; and the second electrochemical cell contact may, for example, include two distinct contacts. One distinct contact may be on the bottom surface of the printed circuit board. The other distinct contact may be on the top surface of the printed circuit board. Any one of the distinct contacts on the top, bottom, or side surfaces of the printed circuit board may be in electrical connection with one or more of the distinct contacts on the top, the bottom, or side surfaces of the printed circuit board through the wiring on or within the printed circuit board.

The at least one electrochemical cell contact; the first electrochemical cell contact; and the second electrochemical cell contact may, for example, include three distinct contacts. One distinct contact may be on the bottom surface of the printed circuit board. Another distinct contact may be on the top surface of the printed circuit board. The other distinct contact may be on the side of the printed circuit board. Any one of the distinct contacts on the top, bottom, or side surfaces of the printed circuit board may be in electrical connection with one or more of the distinct contacts on the top, the bottom, or side surfaces of the printed circuit board through the wiring on or within the printed circuit board.

The at least one electrochemical cell contact may be in electrical connection with the first terminal of the battery. The first electrochemical cell contact may be in electrical connection with the first terminal of the battery. The second electrochemical cell contact may be in electrical connection with the second terminal of the battery. The at least one electrochemical cell contact; the first electrochemical cell contact; and the second electrochemical cell contact may be welded, glued, soldered, compressed, bonded, and the like to the respective terminal of the battery.

At least one tab interconnect may be included between the at least one electrochemical cell contact and the first electrochemical cell contact of the printed circuit board and the first terminal of the battery. The tab interconnect may be made from copper, aluminum, silver, gold, nickel, nickel-plated steel, or other conductive metals. Other suitable materials include conductive foams, conductive polymers, conductive glues, and conductive carbon, such as graphite. The tab interconnect may be welded, glued, soldered, compressed, bonded, and the like to the at least one electrochemical cell contact; the first electrochemical cell contact; and the first terminal of the battery.

At least one conductive trace may electrically connect the on-cell indicator terminal to the on-cell indicator terminal contact of the printed circuit board. A first conductive trace may electrically connect the first on-cell indicator terminal to the first on-cell indicator terminal contact of the printed circuit board. A second conductive trace may electrically connect the second on-cell indicator terminal to the second on-cell indicator terminal contact of the printed circuit board. The at least one conductive trace; the first conductive trace; and the second conductive trace may be made from copper, aluminum, silver, gold, or other conductive metals. Other suitable materials include conductive foams, conductive fluids, conductive polymers, conductive glues, and conductive carbon, such as graphite.

The conductive trace may include an on-cell indicator interconnect at one end of the conductive trace. The conductive trace may include a printed circuit board interconnect at another end of the conductive trace. The on-cell indicator interconnect and the printed circuit board interconnect may be made from copper, aluminum, silver, gold, or other conductive metals. Other suitable materials include conductive foams, conductive fluids, conductive polymers, conductive glues, and conductive carbon, such as graphite.

The first conductive trace may include a first on-cell indicator interconnect at one end of the first conductive trace. The first conductive trace may include a first printed circuit board interconnect at another end of the first conductive trace. The second conductive trace may include a second on-cell indicator interconnect at one end of the second conductive trace. The second conductive trace may include a second printed circuit board interconnect at another end of the second conductive trace. The first on-cell indicator interconnect; the second on-cell indicator interconnect; the first printed circuit board interconnect; and the second printed circuit board interconnect may be made from copper, aluminum, silver, gold, or other conductive metals. Other suitable materials include conductive foams, conductive fluids, conductive polymers, conductive glues, and conductive carbon, such as graphite.

An insulator may be placed between the on-cell indicator, such as an antenna, and the conductive trace. The insulator may be placed between, for example, the antenna and the first and second conductive traces. The insulator a non-conductive sheet, a non-conductive tape, a non-conductive material, a non-conductive substrate, a non-conductive shrink wrap, a polymer, a dielectric, an adhesive, a glue, a passivated coating, an anodized coating, and the like. The insulator may be printed, painted, sputtered, vapor deposited, or spray coated in between the on-cell indicator and the conductive trace.

The integrated circuit (IC) may include a circuit of transistors, resistors, diodes, inductors, and/or capacitors constructed on a single substrate, such as a semiconductor wafer or chip, or a metal, polymer, or a printed circuit board that is based on organic and/or semiconductor material ink, or ceramic substrate, in which the discreet components are interconnected to perform a given function. The IC may comprise a communications circuit and/or an analog-to-digital converter (ADC) electrically coupled together to perform a function, or any number of functions. The IC may be electrically connected to a system ground in order for the IC to perform its function(s). The IC may include other circuits to include, but not to be limited to, an indication circuit, a power circuit, a RFID circuit or block, a NFC circuit or block, an input/output circuit or port, etc. The IC may physically co-locate the communications circuit and ADC together side-by-side or physically integrate them together. The IC may also comprise an application specific integrated circuit (ASIC) that is specifically manufactured to encompass the performance of the function, or any number of functions, that are required. The function may be to determine a specified condition of the battery and relay that information to the reader in the form of function information. The function may also be to signally communicate a notification of the specific condition of the battery or the function may be to provide an indication of the specified condition of the battery which may include audible, visible, or pallesthesia indications. Pallesthesia is the ability to sense a vibration and a pallesthesia indication is a mechanical or electromechanical means to provide the sense of vibration. The IC may signally communicate the specific condition of the battery via a piezoelectric signal that could be audible or result in a change of surface roughness. The IC may be of any suitable shape. The IC may have a rectangular or square shape with a length, width, and height. The IC may be active, semi-active, battery-assisted passive, or may be passive. The IC may be in electrical connection with the first terminal and the second terminal of the battery through the wiring of the printed circuit board, the at least electrochemical cell contact, the first electrochemical cell contact, the second electrochemical cell contact, and, if included, the tab interconnect. The IC may be electrically coupled to the printed circuit board, for example, by a conductive adhesive, such as a silver epoxy, by an anisotropic conductive adhesive, by ultrasonic welding, by resistance welding, by laser welding, by soldering, by bonding, or by mechanical pressure. The IC may be directly printed on, or within, the printed circuit board. The IC may, for example, be positioned on the bottom surface of the printed circuit board. The IC may be, for example, positioned within the printed circuit board. The IC may be, for example, positioned on the top surface of the printed circuit board. The IC may be positioned on a second printed circuit board that is in electrical connection with a first printed circuit board, such as with a flexible-to-flexible printed circuit board or a flexible-to-rigid printed circuit board.

The battery including an on-cell indicator may also include a spacer. The spacer includes a top surface. The top surface of the spacer may include at least one spacer printed circuit board contact. The at least one spacer printed circuit board contact may be made from copper, aluminum, silver, gold, or other conductive metals. Other suitable materials include conductive foams, conductive fluids, conductive polymers, conductive glues, and conductive carbon, such as graphite.

The spacer includes a bottom surface. The bottom surface of the spacer may include at least one spacer electrochemical cell contact. The at least one spacer electrochemical cell contact may be made from copper, aluminum, silver, gold, or other conductive metals. Other suitable materials include conductive foams, conductive fluids, conductive polymers, conductive glues, and conductive carbon, such as graphite.

The top surface and the bottom surface of the spacer may be electrically connected. The spacer may be, for example, a conductive material, such as a solid ring, a conductive tab, a conductive foam, or a conductive tape. The at least one spacer printed circuit board contact and the at least one spacer electrochemical cell contact may be in electrical connection with one another. The first spacer printed circuit board contact and the first spacer electrochemical cell contact may be in electrical connection with one another. The second spacer printed circuit board contact and the second spacer electrochemical cell contact may be in electrical connection with one another.

The battery including an on-cell indicator may also include a magnetic diverter. The magnetic diverter may be any material with high magnetic permeability at a specified frequency and with low electrical conductivity. The magnetic diverter may be, for example, a thin, flexible, ferrite material adjacent between the metal housing of the battery and the on-cell indicator, such as the antenna. The magnetic diverter may be made from iron, nickel, cobalt, any alloys thereof, and any combination thereof. Other materials for the ferrite shield also include oxides which are not substantially electrically conductive. The magnetic diverter may be a film affixed to the surface of the housing or incorporated within a label that covers the housing. The magnetic diverter may be placed, painted, printed, or coated, for example, on the surface of the housing or on the on-cell indicator, e.g., the antenna.

The battery including an on-cell indicator may also include at least one communication circuit. The at least one communication circuit may be any suitable communication circuitry such as radio-frequency identification (RFID) circuitry and near field communication (NFC) circuitry as included within, for example, ISO/IEC 14443 (proximity cards), 15693 (vicinity cards), 15961, 15962, 15963, and 18000 communication standards; Bluetooth circuitry as included within, for example, IEEE 802.15.1 communication standard; WiFi circuitry as included within, for example, IEEE 802.11 communication standard; Zigbee circuitry as included within, for example, IEEE 802 communication standard; Bluetooth Low Energy circuitry as included within, for example, IEEE 802.15.4 communication standard; Long Range Wide Area Network (LoRaWAN) circuitry as included within, for example, the LoRa Alliance communication standard; Z-wave circuitry as included within, for example, International Telecommunications Union (ITU) G.9959 communication standard; any other suitable fixed wireless communication circuitry; and any combinations thereof. The communications circuit may utilize any suitable frequency bands such as low-frequency (from about 125 kHz to about 134.2 kHz and from about 140 kHz to about 148.5 kHz); high frequency (HF) (13.56 MHz); ultra-high frequency (UHF) (860-956 MHz); or microwave frequency (2.4-5.8 GHz). In addition, other communications circuitry may be used, such as audible or inaudible sound or visible light.

The battery including an on-cell indicator may also include a label. The label may be a laminated multi-layer film with a transparent or translucent layer bearing the label graphics and text. The label may be made from polyvinyl chloride (PVC), polyethylene terephthalate (PET), and other similar polymer materials. The label includes an inner surface and an outer surface. The at least one conductive trace; the first conductive trace; and the second conductive trace may be included on or within the label. The at least one on-cell indicator interconnect; the first on-cell indicator interconnect; and the second on-cell indicator interconnect may be included on or within the label. The at least one on-cell indicator, for example at least one antenna, may be on or within the label. The insulator may be placed in between the at least one antenna and the at least one conductive trace; the first conductive trace; and the second conductive trace that are included on or within the label.

A reader, or computing device, may be any device capable of communicating with the on-cell indicator of the battery. Specific examples of the reader include a smartphone, tablet, a personal computer (PC) with NFC adapter, a dedicated RFID indicator circuit reader, a dedicated NFC indicator circuit reader, a handheld computing device, or a wand antenna electrically coupled to a computing device. The reader may be used to send energy to the IC by transmitting an interrogation signal or may transmit a "wake-up" signal to the IC. The interrogation signal may be a RF pulse of a predetermined frequency used to energize the circuit in the IC and provide power to the IC to transmit its function information. The "wake-up" signal may be a RF pulse, but the IC may use power from another source to power the IC and to transmit its function information. The reader may include a display to visibly present the function information or an audible device capable of audibly presenting the function information. The reader may also include algorithms to interpret and/or modify the function information before presenting the information to a user.

The IC of the indicator circuit may perform any number of a series of functions with respect to the battery. The IC may provide information regarding: power output of the battery; rate of discharge of the battery; when the battery is nearing the end of its useful life; geo-tracking of the battery; and state of charge of the battery. The IC may also provide: over-discharge protection; over-charge protection; remaining capacity determination; voltage determination; cycle life determination; and power management. Power management functions may include battery identification; battery state of health; battery protection; cell balancing; fuel gauging; charge control; voltage conversion; voltage rectification; current rectification; load regulation; powering the battery on/off; power setting adjustment; allow or prevent charging; allow or prevent discharging; battery by-pass; temperature monitoring; and charging rate adjustment. The IC may be used, for example, in an on-cell remote indication system to provide information about the battery to, for example, the user through a graphical user interface on the reader. The IC may also be configured with a unique identifier, such as an RFID indicator circuit equivalent, that indicates either a unique sequence of numbers/symbols or information such as, for example, manufacturing date, lot number, serial number, and other identifiable information. The IC may also include memory to store information, such as the manufacturing date, the lot number, the serial number, and the other identifiable information. The may have read/write capability to enable, for example, data logging.

The battery including an on-cell indicator, as is described above, may communicate to the user various characteristics of the battery, such as remaining capacity. The battery including an on-cell indicator communicates the battery characteristics to the user without manual interaction between the user and the battery and/or indicator. The battery including an on-cell indicator, as is described above, may also include advanced processing and communication capabilities external to the housing of the battery. This facilitates the added capability of on-cell indication without detrimentally impacting the volume internal to the housing that is available for components that, such as anode material and cathode material, contribute to the capacity of the battery. In addition, the on-cell indicator components, although external to the battery, do not detrimentally impact the external dimensions of the battery with respect to standard battery dimensions, such as the IEC standards. In addition, the on-cell indicator as described above easily connects to the battery and facilitates an increase in the speed and repeatability of manufacture for the battery including an on-cell indicator.

Referring to FIG. 1, a battery including an on-cell indicator is shown. The battery including an on-cell indicator includes at least one electrochemical cell (110); at least one on-cell indicator (120); a printed circuit board (130); at least one conductive trace (150); and at least one integrated circuit (not shown). The at least one electrochemical cell (110) includes a first terminal (112) and a second terminal (114). The at least one on-cell indicator (120) includes at least one on-cell indicator terminal (122). The printed circuit board (130) includes a top surface (132). The top surface (132) of the printed circuit board (130) includes at least one on-cell indicator terminal contact (140). The at least one conductive trace (150) includes an on-cell indicator interconnect (153) and a printed circuit board interconnect (156). The at least one on-cell indicator (120) is an antenna. An insulator (190) is located between the at least one conductive trace (150) and the antenna. The on-cell indicator interconnect (153) is in electrical connection with the at least one on-cell indicator terminal (122). The printed circuit board interconnect (156) is in electrical connection with the at least one on-cell indicator terminal contact (140). The at least one integrated circuit (not shown) is in electrical connection with the printed circuit board (130).

Figure 2:
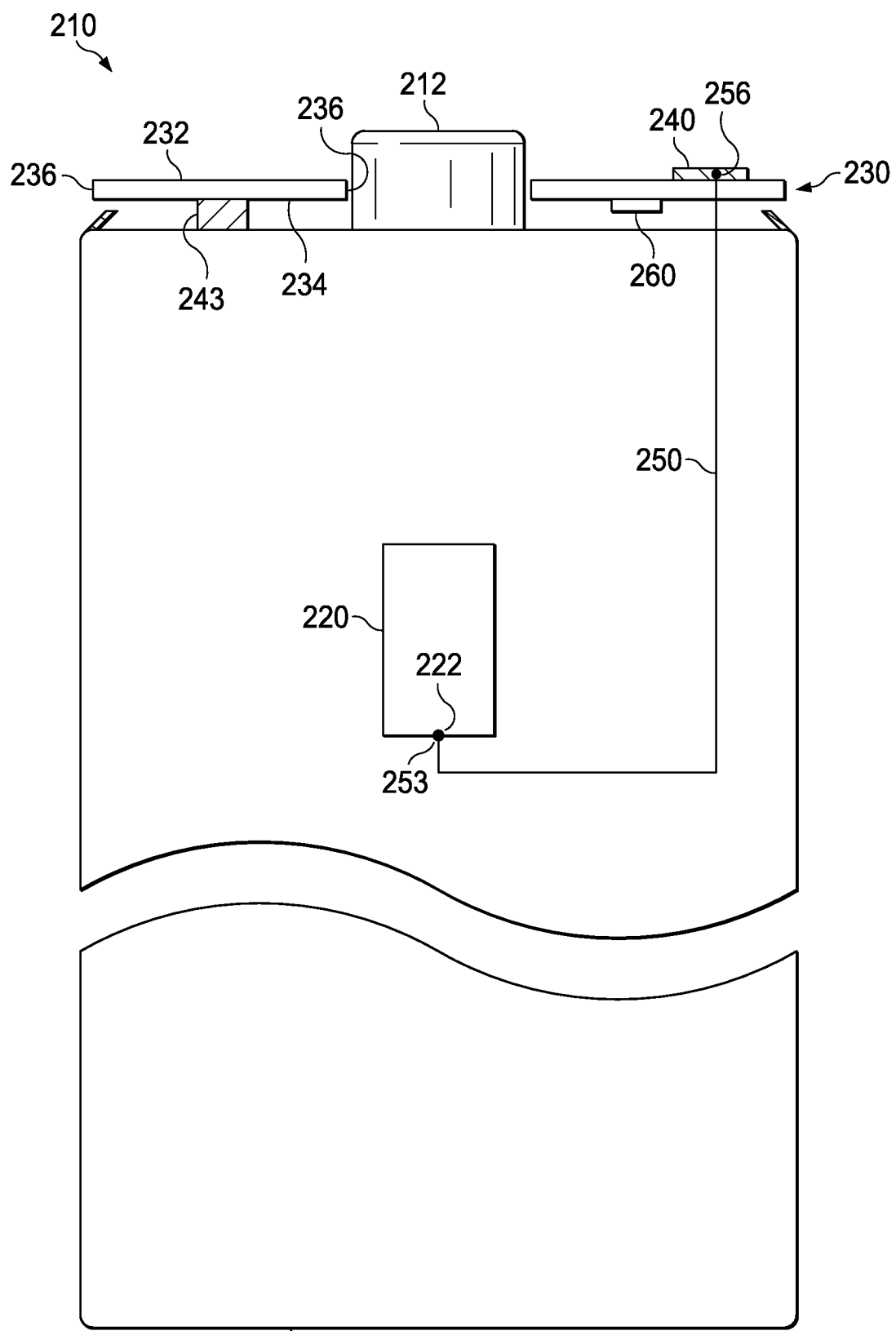
FIG. 2 is a cross-section of another battery including an on-cell indicator according to one or more embodiments shown and described herein.

Referring to FIG. 2, a battery including an on-cell indicator is shown. The battery including an on-cell indicator includes at least one electrochemical cell (210); at least one on-cell indicator (220); a printed circuit board (230); at least one conductive trace (250); and at least one integrated circuit (260). The at least one electrochemical cell (210) includes a first terminal (212) and a second terminal (214). The at least one on-cell indicator (220) includes at least one on-cell indicator terminal (222). The printed circuit board (230) includes a top surface (232), a bottom surface (234), and a side surface (236). The top surface (232) of the printed circuit board (230) includes at least one on-cell indicator terminal contact (240). The bottom surface (234) of the printed circuit board (230) includes at least one electrochemical cell contact (243). The at least one electrochemical cell contact (243) is in electrical connection with the first terminal (212) of the at least one electrochemical cell (210). The at least one conductive trace (250) includes an on-cell indicator interconnect (253) and a printed circuit board interconnect (256). The on-cell indicator interconnect (253) is in electrical connection with the at least one on-cell indicator terminal (222). The printed circuit board interconnect (256) is in electrical connection with the at least one on-cell indicator terminal contact (240). The at least one integrated circuit (260) is in electrical connection with the printed circuit board (230).

Figure 3:
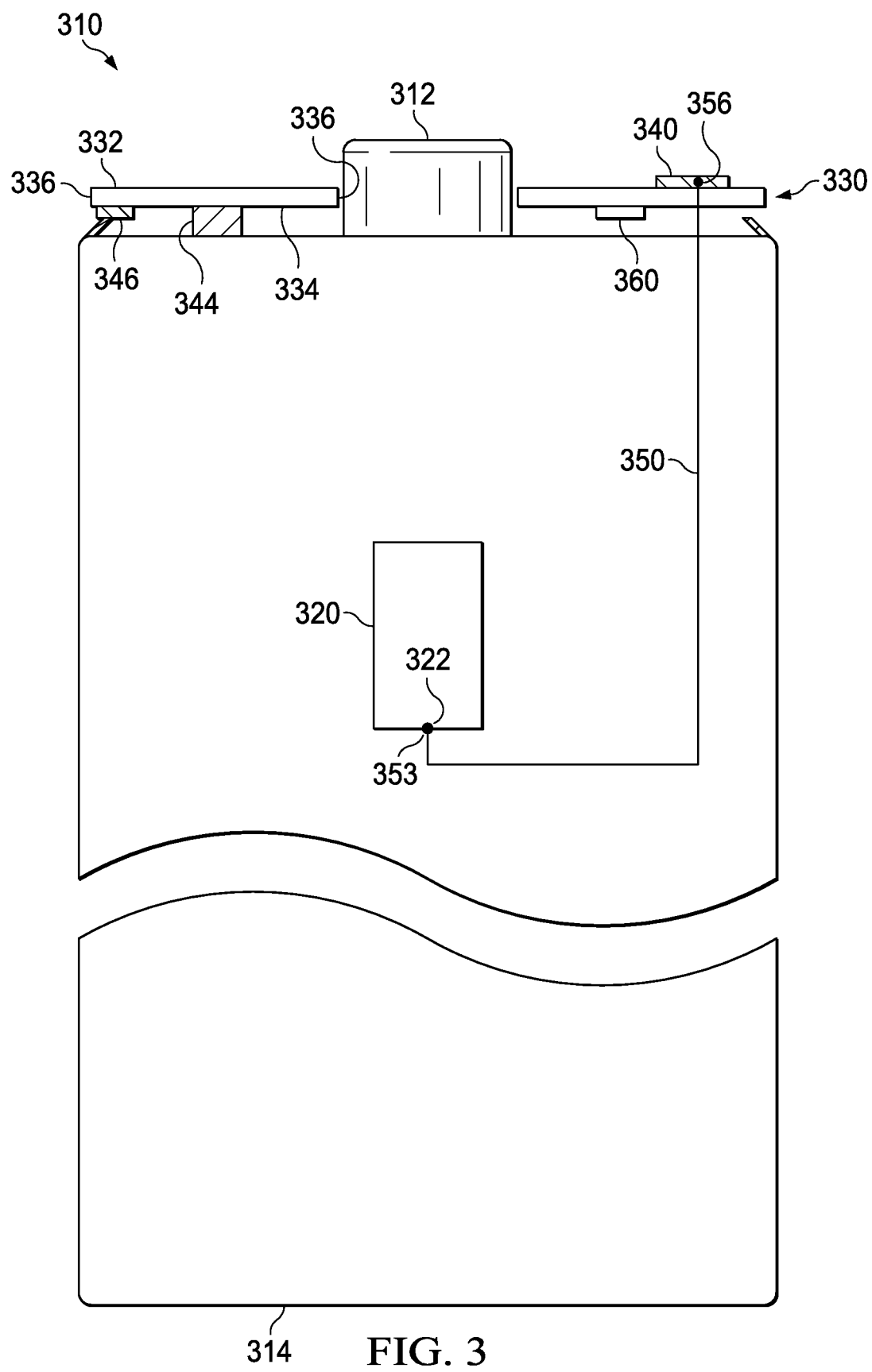
FIG. 3 is a cross-section of another battery including an on-cell indicator according to one or more embodiments shown and described herein.

Referring to FIG. 3, a battery including an on-cell indicator is shown. The battery including an on-cell indicator includes at least one electrochemical cell (310); at least one on-cell indicator (320); a printed circuit board (330); at least one conductive trace (350); and at least one integrated circuit (360). The at least one electrochemical cell (310) includes a first terminal (312) and a second terminal (314). The at least one on-cell indicator (320) includes at least one on-cell indicator terminal (322). The printed circuit board (330) includes a top surface (332), a bottom surface (334), and a side surface (336). The top surface (332) of the printed circuit board (330) includes at least one on-cell indicator terminal contact (340). The bottom surface (334) of the printed circuit board (330) includes a first electrochemical cell contact (344) and a second electrochemical cell contact (346). The first electrochemical cell contact (344) is in electrical connection with the first terminal (312) of the at least one electrochemical cell (310). The second electrochemical cell contact (346) is in electrical connection with the second terminal (314) of the at least one electrochemical cell (310). The at least one conductive trace (350) includes an on-cell indicator interconnect (353) and a printed circuit board interconnect (356). The on-cell indicator interconnect (353) is in electrical connection with the at least one on-cell indicator terminal (322). The printed circuit board interconnect (356) is in electrical connection with the at least one on-cell indicator terminal contact (340). The at least one integrated circuit (360) is in electrical connection with the printed circuit board (330).

Figure 4:
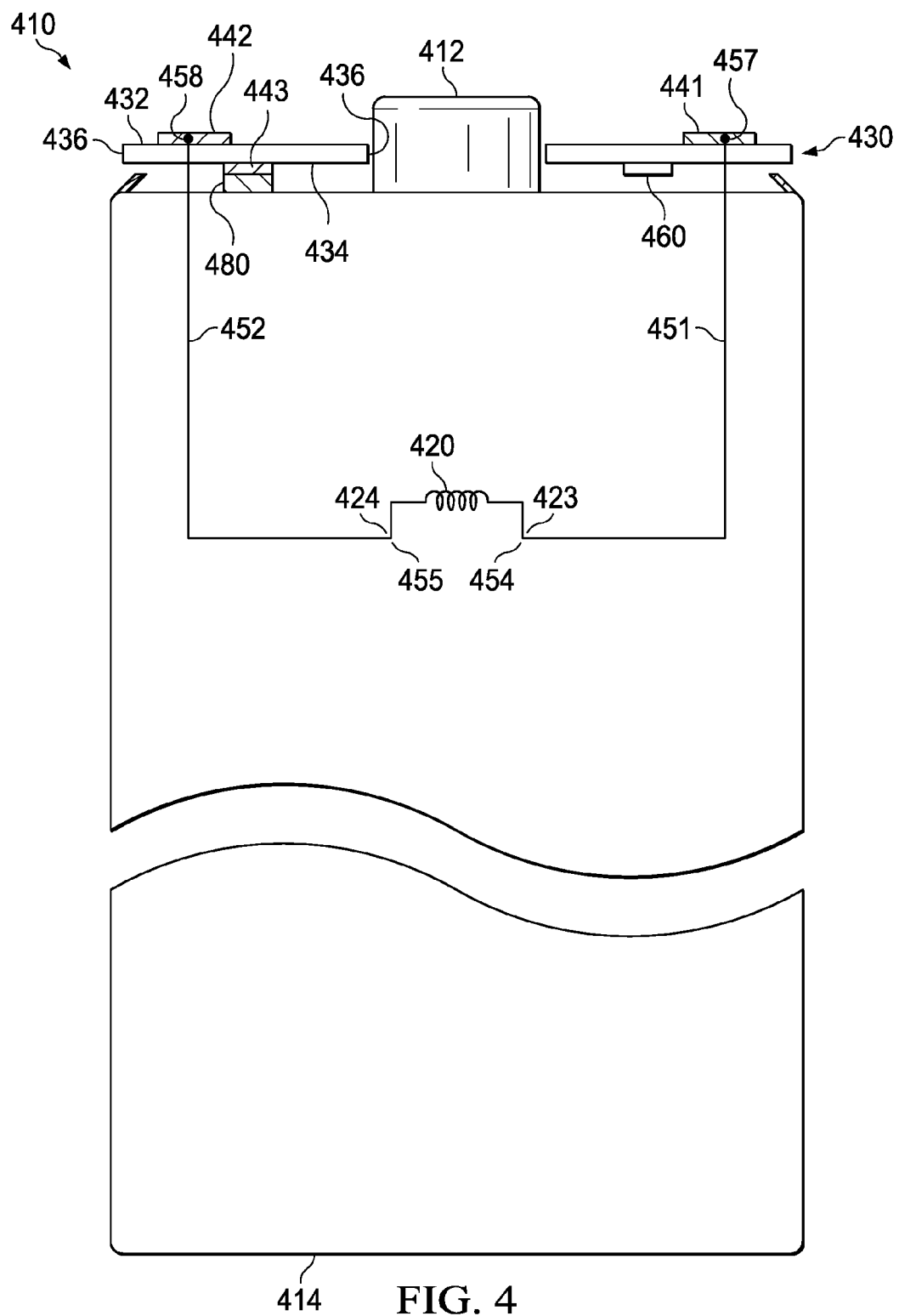
FIG. 4 is a cross-section of another battery including an on-cell indicator according to one or more embodiments shown and described herein.

Referring to FIG. 4, a battery including an on-cell indicator is shown. The battery including an on-cell indicator includes at least one electrochemical cell (410); at least one on-cell indicator (420); a printed circuit board (430); a first conductive trace (451); a second conductive trace (452); and at least one integrated circuit (460). The at least one electrochemical cell (410) includes a first terminal (412) and a second terminal (414). The at least one on-cell indicator (420) is an antenna. The on-cell indicator (420), e.g., the antenna, includes a first on-cell indicator terminal (423) and a second on-cell indicator terminal (424). The printed circuit board (430) includes a top surface (432), a bottom surface (434), and a side surface (436). The top surface (432) of the printed circuit board (430) includes a first on-cell indicator terminal contact (441) and a second on-cell terminal contact (442). The bottom surface (434) of the printed circuit board (430) includes at least one electrochemical cell contact (443). The at least one electrochemical cell contact (443) is in electrical connection with the first terminal (412) of the at least one electrochemical cell (410) through a tab interconnect (480). The first conductive trace (451) includes a first on-cell indicator interconnect (454) and a first printed circuit board interconnect (457). The first on-cell indicator interconnect (454) is in electrical connection with the first on-cell indicator terminal (423). The first printed circuit board interconnect (457) is in electrical connection with the first on-cell indicator terminal contact (441). The second conductive trace (452) includes a second on-cell indicator interconnect (455) and a second printed circuit board interconnect (458). The second on-cell indicator interconnect (455) is in electrical connection with the second on-cell indicator terminal (424). The second printed circuit board interconnect (458) is in electrical connection with the second on-cell indicator terminal contact (442). The at least one integrated circuit (460) is in electrical connection with the printed circuit board (430).

Figure 5:
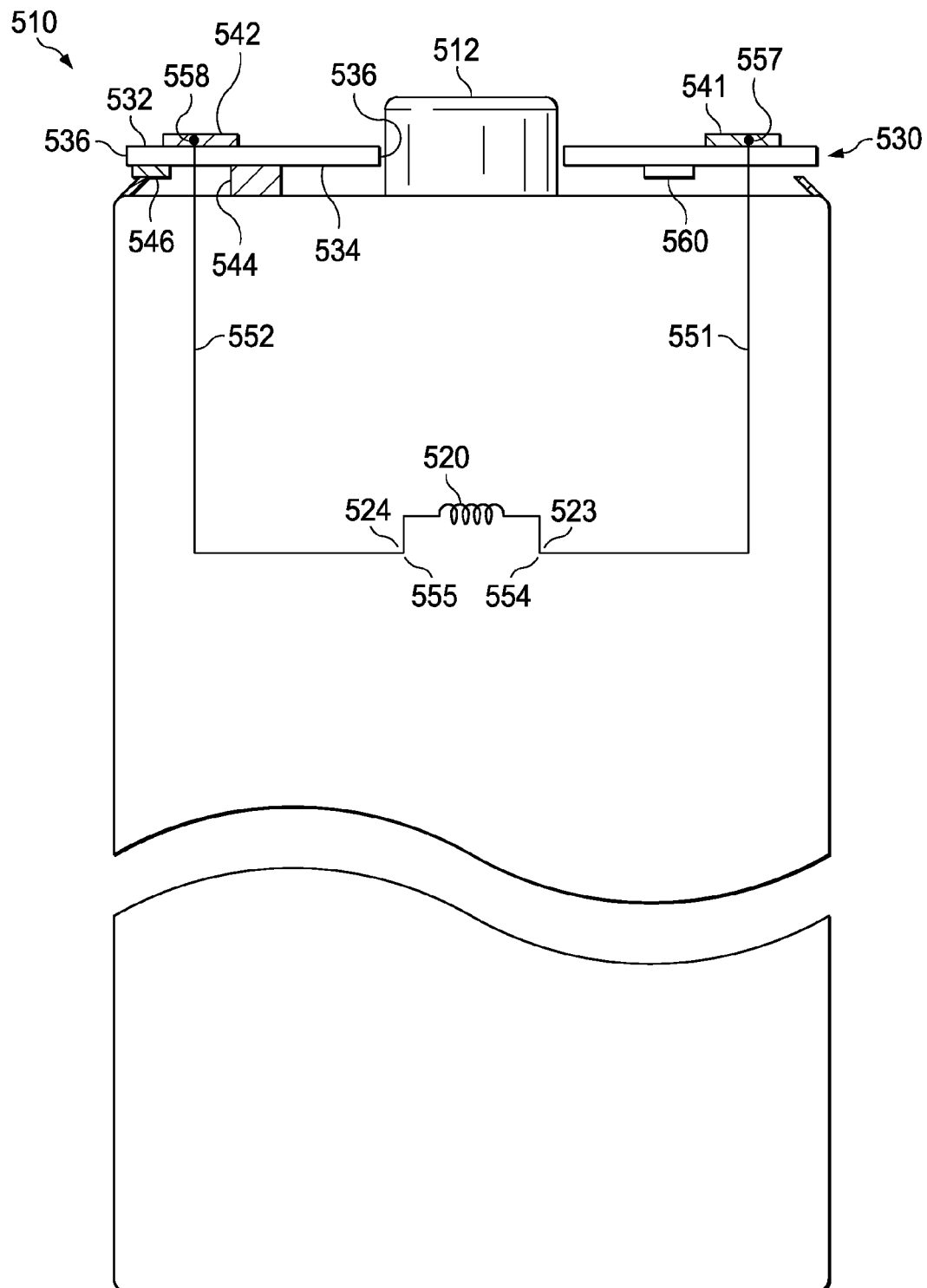
FIG. 5 is a cross-section of another battery including an on-cell indicator according to one or more embodiments shown and described herein.

Referring to FIG. 5, a battery including an on-cell indicator is shown. The battery including an on-cell indicator includes at least one electrochemical cell (510); at least one on-cell indicator (520); a printed circuit board (530); a first conductive trace (551); a second conductive trace (552); and at least one integrated circuit (560). The at least one electrochemical cell (510) includes a first terminal (512) and a second terminal (514). The at least one on-cell indicator (520) is an antenna. The on-cell indicator (520), e.g., the antenna, includes a first on-cell indicator terminal (523) and a second on-cell indicator terminal (524). The printed circuit board (530) includes a top surface (532), a bottom surface (534), and a side surface (536). The top surface (532) of the printed circuit board (530) includes a first on-cell indicator terminal contact (541) and a second on-cell terminal contact (542). The bottom surface (534) of the printed circuit board (530) includes a first electrochemical cell contact (544) and a second electrochemical cell contact (546). The first electrochemical cell contact (544) is in electrical connection with the first terminal (512) of the at least one electrochemical cell (510). The second electrochemical cell contact (546) is in electrical connection with the second terminal (514) of the at least one electrochemical cell (510). The first conductive trace (551) includes a first on-cell indicator interconnect (554) and a first printed circuit board interconnect (557). The first on-cell indicator interconnect (554) is in electrical connection with the first on-cell indicator terminal (523). The first printed circuit board interconnect (557) is in electrical connection with the first on-cell indicator terminal contact (541). The second conductive trace (552) includes a second on-cell indicator interconnect (555) and a second printed circuit board interconnect (558). The second on-cell indicator interconnect (555) is in electrical connection with the second on-cell indicator terminal (524). The second printed circuit board interconnect (558) is in electrical connection with the second on-cell indicator terminal contact (542). The at least one integrated circuit (560) is in electrical connection with the printed circuit board (530).

Figure 6:
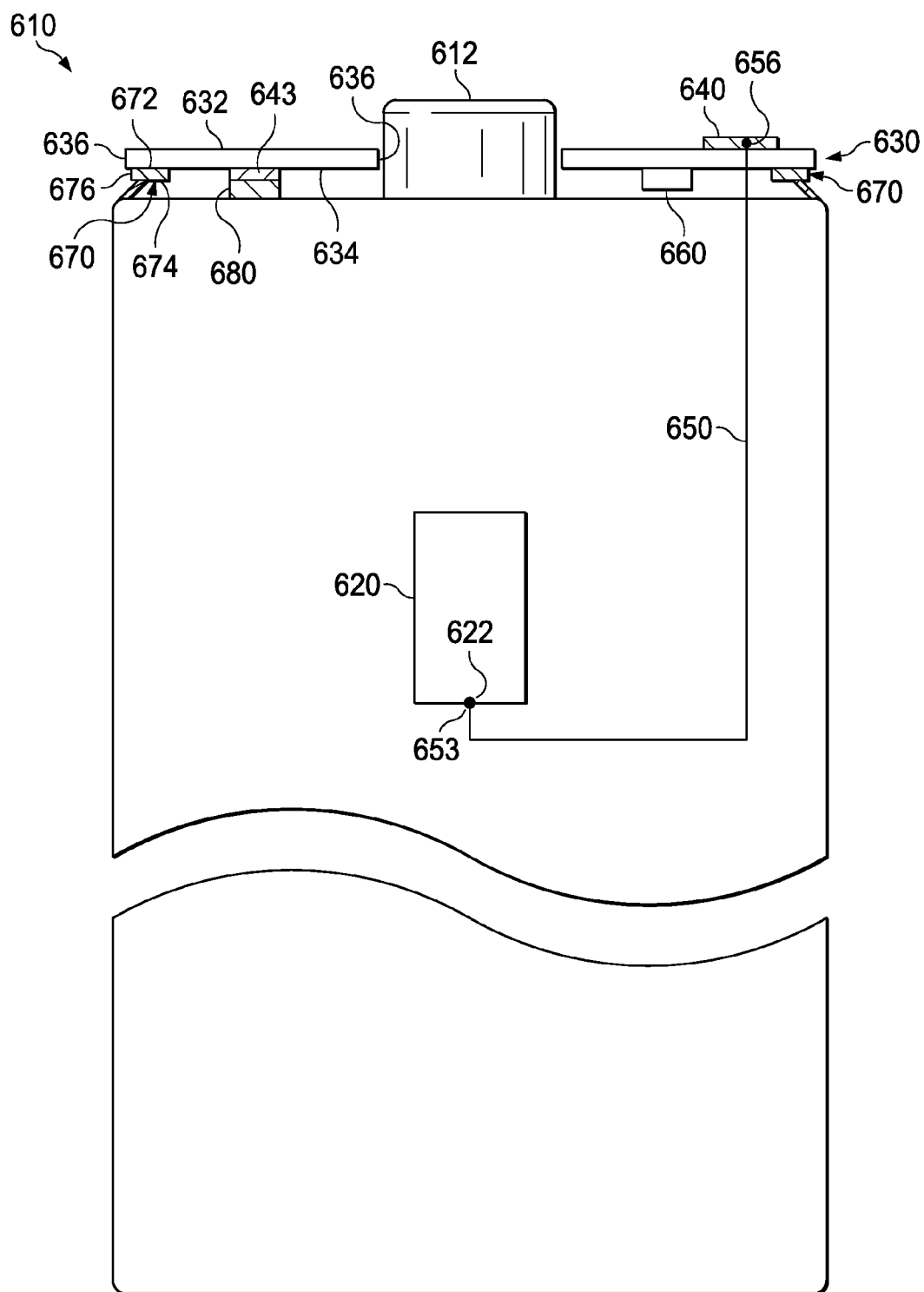
FIG. 6 is a cross-section of another battery including an on-cell indicator according to one or more embodiments shown and described herein.

Referring to FIG. 6, a battery including an on-cell indicator is shown. The battery including an on-cell indicator includes at least one electrochemical cell (610); at least one on-cell indicator (620); a printed circuit board (630); a spacer (670); at least one conductive trace (650); and at least one integrated circuit (660). The at least one electrochemical cell (610) includes a first terminal (612) and a second terminal (614). The at least one on-cell indicator (620) includes at least one on-cell indicator terminal (622). The printed circuit board (630) includes a top surface (632), a bottom surface (634), and a side surface (636). The top surface (632) of the printed circuit board (630) includes at least one on-cell indicator terminal contact (640). The bottom surface (634) of the printed circuit board (630) includes at least one electrochemical cell contact (643). The at least one electrochemical cell contact (643) is in electrical connection with the first terminal (612) of the at least one electrochemical cell (610) through a tab interconnect (680). The spacer (670) includes a top surface (672), a bottom surface (674), and side surface (676). The spacer (670) is placed between the printed circuit board (630) and the electrochemical cell (610). The top surface (672) of the spacer (670) is in contact with the bottom surface (634) of the printed circuit board (630). The bottom surface (674) of the spacer (670) is in contact with the second terminal (614) of the electrochemical cell (610). The at least one conductive trace (650) includes an on-cell indicator interconnect (653) and a printed circuit board interconnect (656). The on-cell indicator interconnect (653) is in electrical connection with the at least one on-cell indicator terminal (622). The printed circuit board interconnect (656) is in electrical connection with the at least one on-cell indicator terminal contact (640). The at least one integrated circuit (660) is in electrical connection with the printed circuit board (630).

Figure 7:
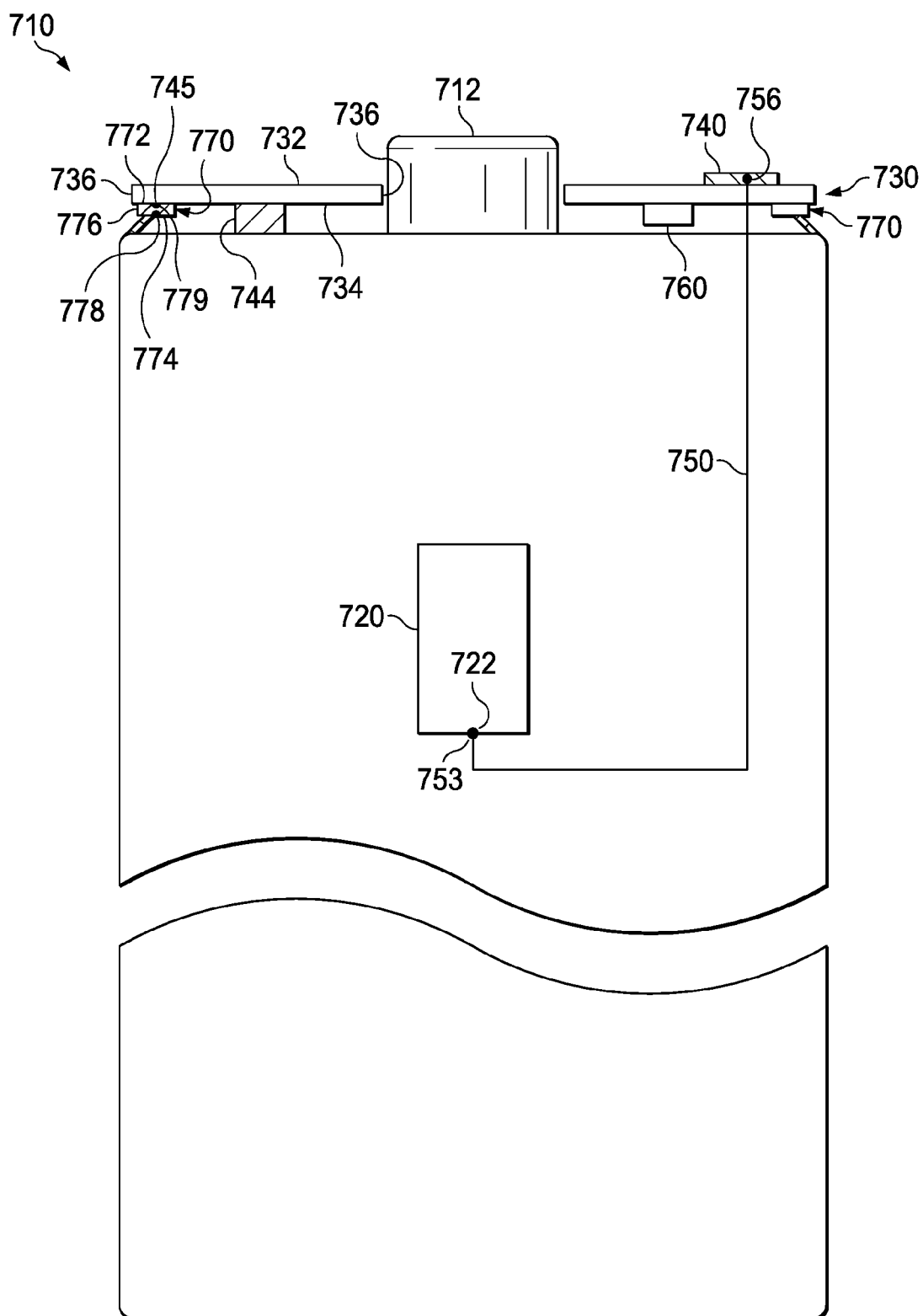
FIG. 7 is a cross-section of another battery including an on-cell indicator according to one or more embodiments shown and described herein.

Referring to FIG. 7, a battery including an on-cell indicator is shown. The battery including an on-cell indicator includes at least one electrochemical cell (710); at least one on-cell indicator (720); a printed circuit board (730); a spacer (770); at least one conductive trace (750); and at least one integrated circuit (760). The at least one electrochemical cell (710) includes a first terminal (712) and a second terminal (714). The at least one on-cell indicator (720) includes at least one on-cell indicator terminal (722). The printed circuit board (730) includes a top surface (732), a bottom surface (734), and a side surface (736). The top surface (732) of the printed circuit board (730) includes at least one on-cell indicator terminal contact (740). The bottom surface (734) of the printed circuit board (730) includes a first electrochemical cell contact (744) and a second electrochemical cell contact (745). The first electrochemical cell contact (744) is in electrical connection with the first terminal (712) of the at least one electrochemical cell (710). The spacer (770) includes a top surface (772), a bottom surface (774), and side surface (776). The spacer (770) is placed between the printed circuit board (730) and the electrochemical cell (710). The top surface (772) of the spacer (770) includes a spacer printed circuit board contact (779). The spacer printed circuit board contact (779) is in electrical connection with the second electrochemical cell contact (745) on the bottom surface (734) of the printed circuit board (730). The bottom surface (774) of the spacer (770) includes a spacer electrochemical cell contact (778). The spacer electrochemical cell contact (778) is in electrical connection with the second terminal (714) of the at least one electrochemical cell (710). The at least one conductive trace (750) includes an on-cell indicator interconnect (753) and a printed circuit board interconnect (756). The on-cell indicator interconnect (753) is in electrical connection with the at least one on-cell indicator terminal (722). The printed circuit board interconnect (756) is in electrical connection with the at least one on-cell indicator terminal contact (740). The at least one integrated circuit (760) is in electrical connection with the printed circuit board (730).

Figure 8:
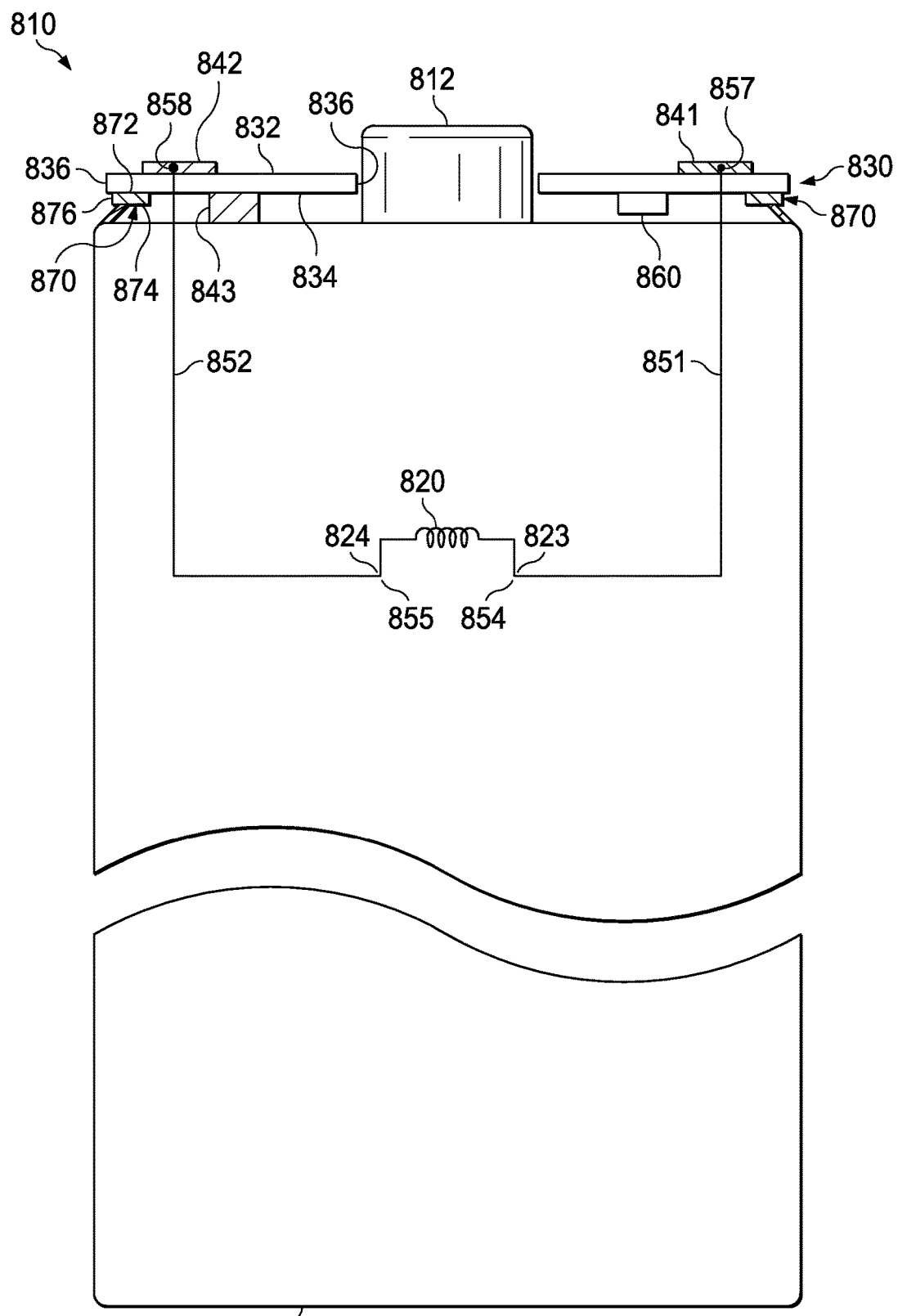
FIG. 8 is a cross-section of another battery including an on-cell indicator according to one or more embodiments shown and described herein.

Referring to FIG. 8, a battery including an on-cell indicator is shown. The battery including an on-cell indicator includes at least one electrochemical cell (810); at least one on-cell indicator (820); a printed circuit board (830); a spacer (870); a first conductive trace (851); a second conductive trace (852); and at least one integrated circuit (860). The at least one electrochemical cell (810) includes a first terminal (812) and a second terminal (814). The at least one on-cell indicator (820) is an antenna. The on-cell indicator (820), e.g., the antenna, includes a first on-cell indicator terminal (823) and a second on-cell indicator terminal (824). The printed circuit board (830) includes a top surface (832), a bottom surface (834), and a side surface (836). The top surface (832) of the printed circuit board (830) includes a first on-cell indicator terminal contact (841) and a second on-cell indicator contact (842). The bottom surface (834) of the printed circuit board (830) includes at least one electrochemical cell contact (843). The at least one electrochemical cell contact (843) is in electrical connection with the first terminal (812) of the at least one electrochemical cell (810).

The spacer (870) includes a top surface (872), a bottom surface (874), and side surface (876). The spacer (870) is placed between the printed circuit board (830) and the electrochemical cell (810). The top surface (872) of the spacer (870) is in contact with the bottom surface (834) of the printed circuit board (830). The bottom surface (874) of the spacer (870) is in contact with the second terminal (814) of the electrochemical cell (810). The first conductive trace (851) includes a first on-cell indicator interconnect (854) and a first printed circuit board interconnect (857). The first on-cell indicator interconnect (854) is in electrical connection with the first on-cell indicator terminal (823). The first printed circuit board interconnect (857) is in electrical connection with the first on-cell indicator terminal contact (841). The second conductive trace (852) includes a second on-cell indicator interconnect (855) and a second printed circuit board interconnect (858). The second on-cell indicator interconnect (855) is in electrical connection with the second on-cell indicator terminal (824). The second printed circuit board interconnect (858) is in electrical connection with the second on-cell indicator terminal contact (842). The at least one integrated circuit (860) is in electrical connection with the printed circuit board (830).

Figure 9:
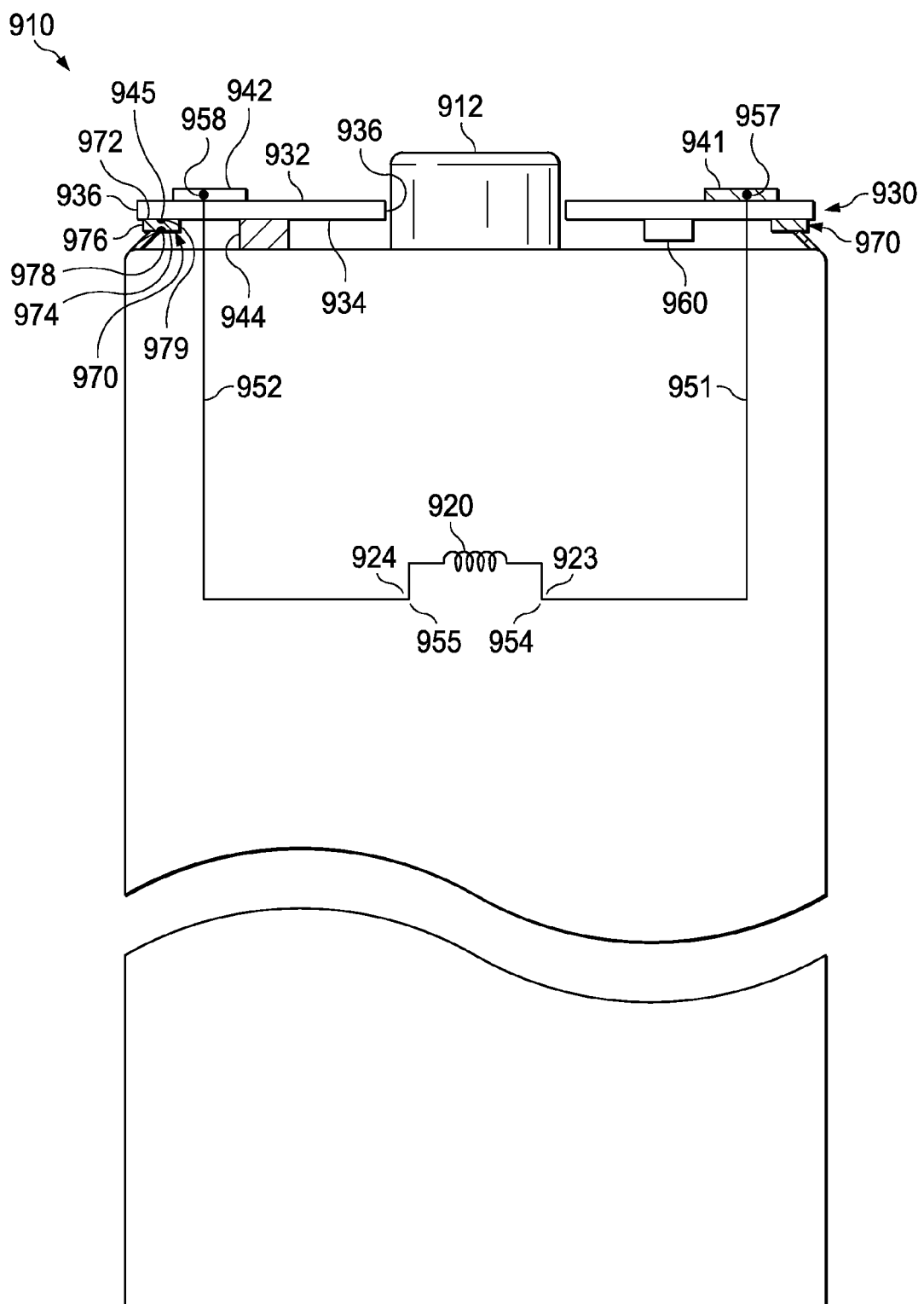
FIG. 9 is a cross-section of another battery including an on-cell indicator according to one or more embodiments shown and described herein.

Referring to FIG. 9, a battery including an on-cell indicator is shown. The battery including an on-cell indicator includes at least one electrochemical cell (910); at least one on-cell indicator (920); a printed circuit board (930); a spacer (970); a first conductive trace (951); a second conductive trace (952); and at least one integrated circuit (960). The at least one electrochemical cell (910) includes a first terminal (912) and a second terminal (914). The at least one on-cell indicator (920) is an antenna. The on-cell indicator (920), e.g., the antenna, includes a first on-cell indicator terminal (923) and a second on-cell indicator terminal (924). The printed circuit board (930) includes a top surface (932), a bottom surface (934), and a side surface (936). The top surface (932) of the printed circuit board (930) includes a first on-cell indicator terminal contact (941) and a second on-cell indicator terminal contact (942). The bottom surface (934) of the printed circuit board (930) includes a first electrochemical cell contact (944) and a second electrochemical cell contact (945). The first electrochemical cell contact is in electrical connection with the first terminal (912) of the at least one electrochemical cell (910). The spacer (970) includes a top surface (972), a bottom surface (974), and side surface (976). The spacer (970) is placed between the printed circuit board (930) and the electrochemical cell (910). The top surface (972) of the spacer (970) includes a spacer printed circuit board contact (979). The spacer printed circuit board contact (979) is in electrical connection with the second electrochemical cell contact (945) on the bottom surface (934) of the printed circuit board (930). The bottom surface (974) of the spacer (970) includes a spacer electrochemical cell contact (978). The spacer electrochemical cell contact (978) is in electrical connection with the second terminal (914) of the at least one electrochemical cell (910). The first conductive trace (951) includes a first on-cell indicator interconnect (954) and a first printed circuit board interconnect (957). The first on-cell indicator interconnect (954) is in electrical connection with the first on-cell indicator terminal (923). The first printed circuit board interconnect (957) is in electrical connection with the first on-cell indicator terminal contact (941). The second conductive trace (952) includes a second on-cell indicator interconnect (955) and a second printed circuit board interconnect (958). The second on-cell indicator interconnect (955) is in electrical connection with the second on-cell indicator terminal (924). The second printed circuit board interconnect (958) is in electrical connection with the second on-cell indicator terminal contact (942). The at least one integrated circuit (960) is in electrical connection with the printed circuit board (930).

Figure 10:
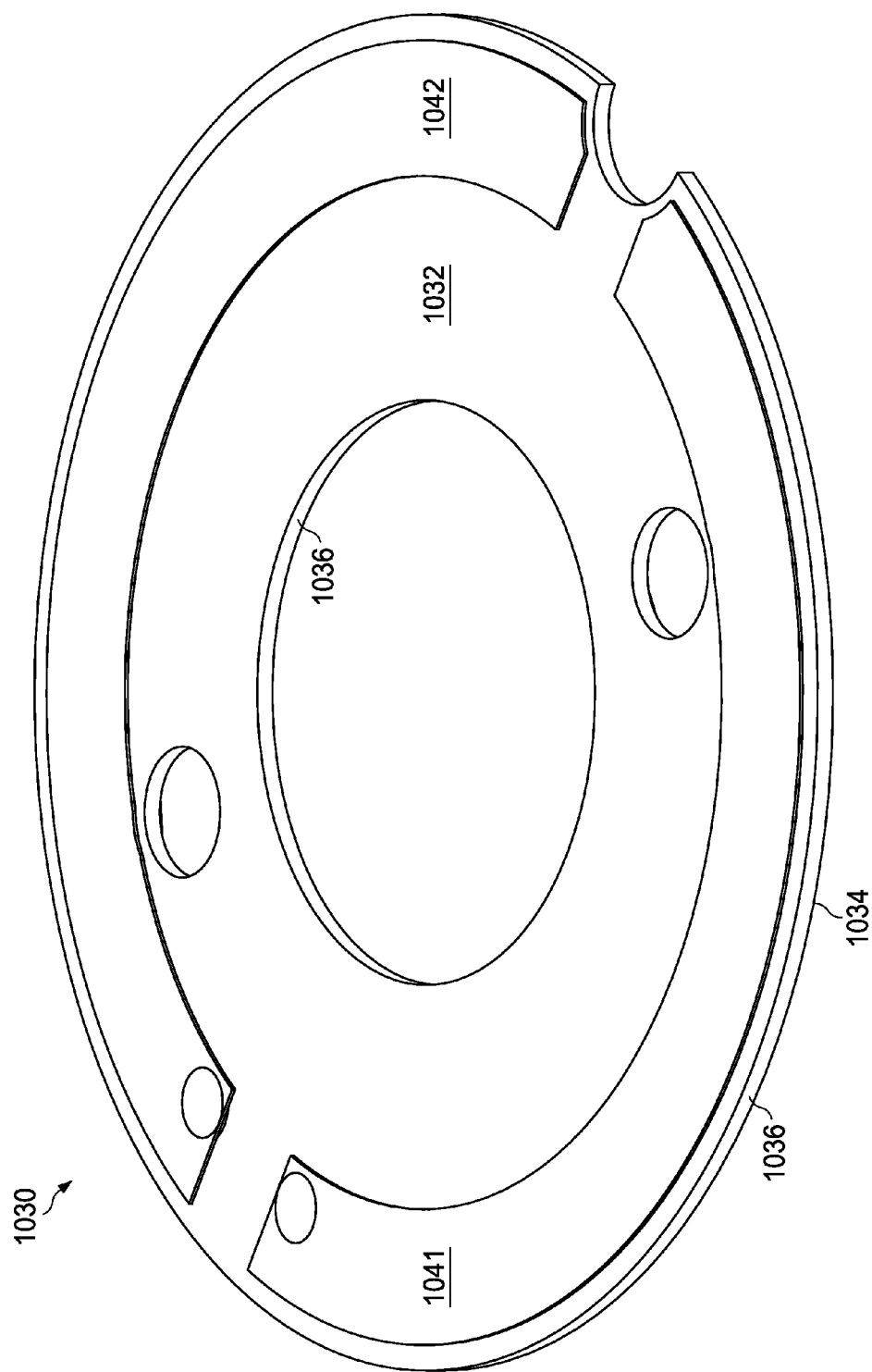
FIG. 10 is a perspective view of a printed circuit board for use within a battery including an on-cell indicator according to one or more embodiments shown and described herein.

Referring to FIG. 10, a printed circuit board (1030) is shown. The printed circuit board (1030) includes a top surface (1032), a bottom surface (1034), and a side surface (1036). The top surface (1032) of the printed circuit board (1030) includes a first on-cell indicator terminal contact (1041) and a second on-cell indicator terminal contact (1042). An integrated circuit (not shown) is in electrical contact with the printed circuit board (1030)

Figure 11:
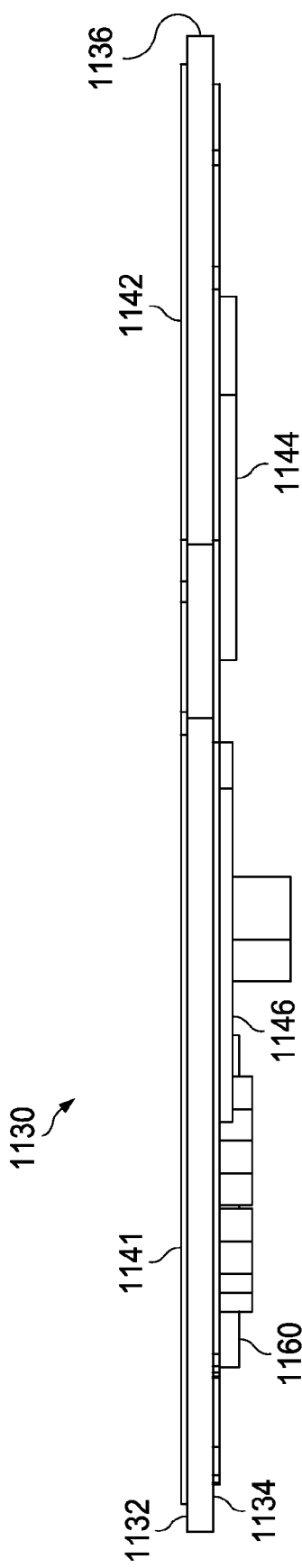
FIG. 11 is a side view of the printed circuit board of FIG. 10.

Referring to FIG. 11, another view of the printed circuit board (1130) of FIG. 10 is shown. The top surface (1132) of the printed circuit board (1130) includes the first on-cell indicator terminal contact (1141) and the second on-cell indicator terminal contact (1142). The bottom surface (1134) of the printed circuit board (1130) includes the first electrochemical cell contact (1144), the second electrochemical cell contact (1146), and the integrated circuit (1160).

Figure 12:
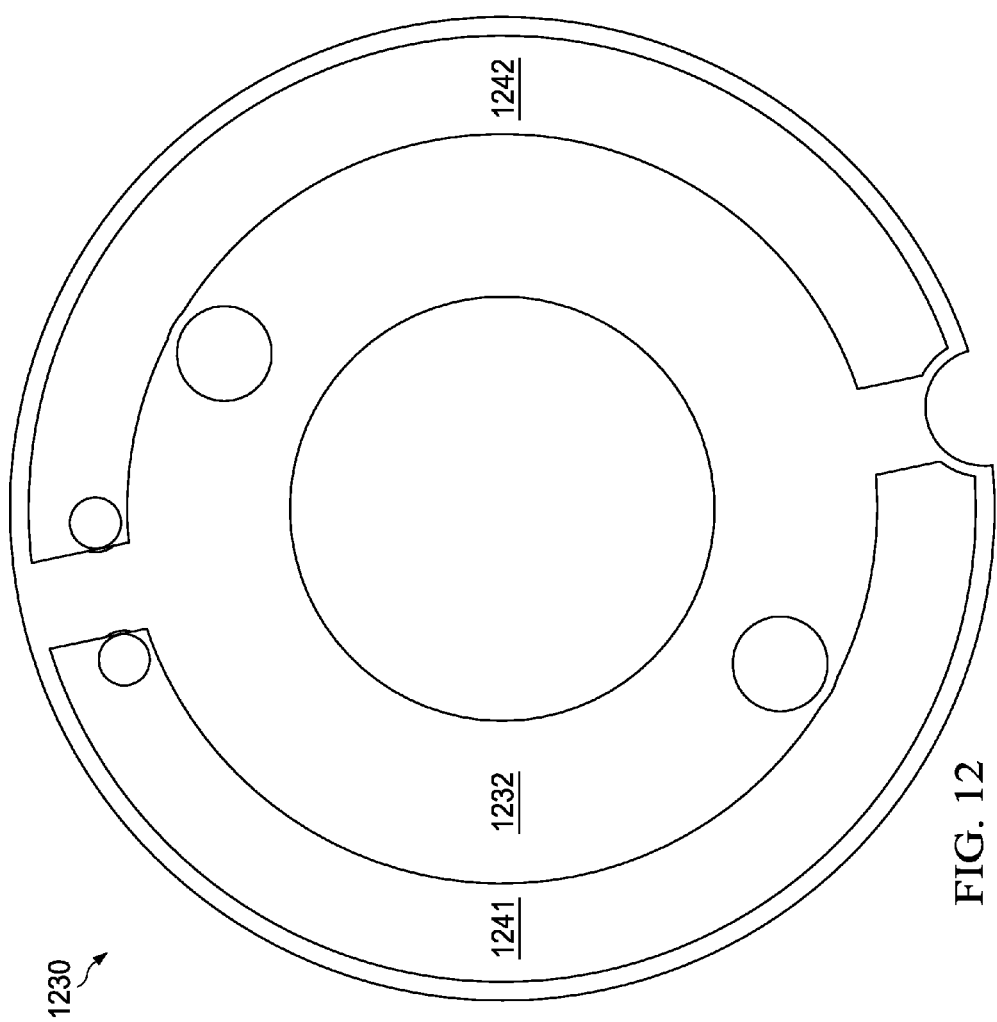
FIG. 12 is a top view of the printed circuit board of FIGS. 10 and 11.

Referring to FIG. 12, another view of the printed circuit board (1230) of FIGS. 10 and 11 is shown. The top surface (1232) of the printed circuit board (1230) includes the first on-cell indicator terminal contact (1241) and the second on-cell indicator terminal contact (1242).

Figure 13:
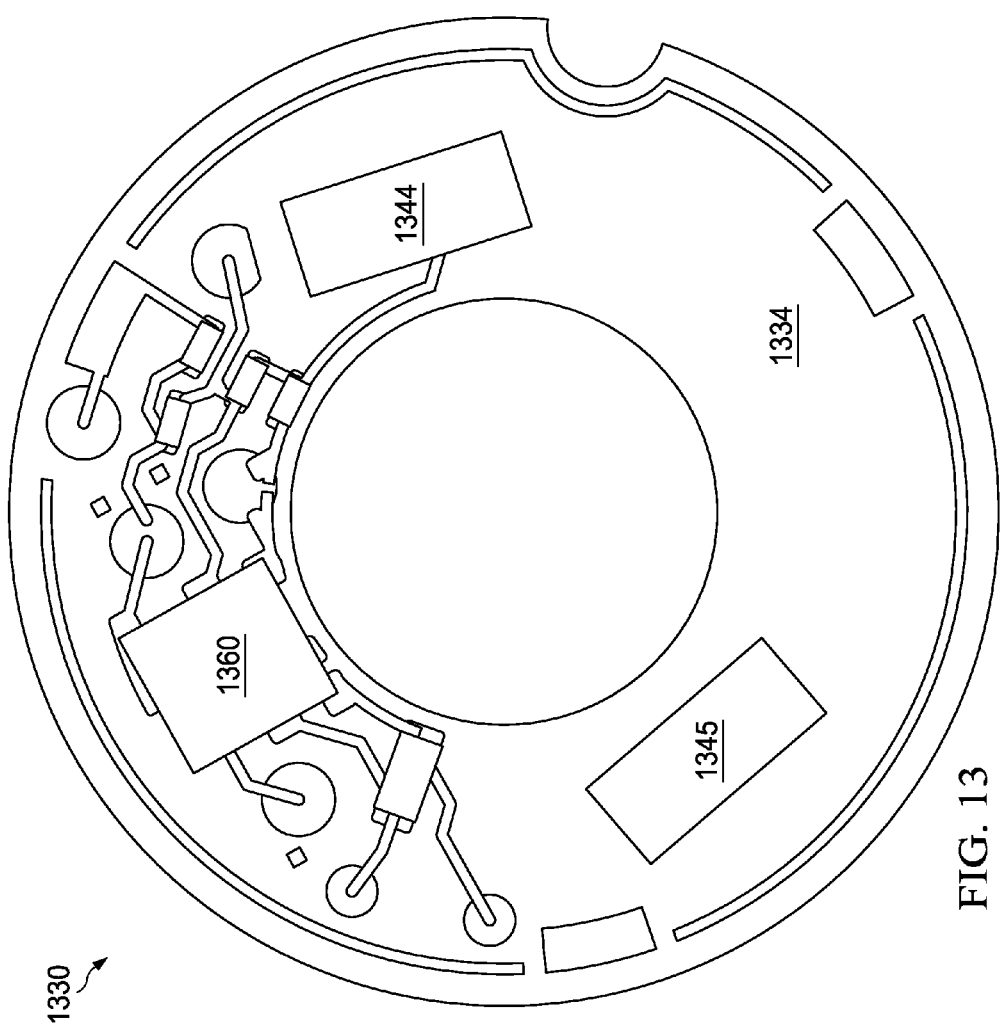
FIG. 13 is a bottom of the printed circuit board of FIGS. 10, 11, and 12.

Referring to FIG. 13, another view of the printed circuit board (1330) of FIGS. 10, 11, and 12 is shown. The bottom surface (1334) of the printed circuit board (1330) includes the first electrochemical cell contact (1344), the second electrochemical cell contact (1345), and the integrated circuit (1360).

Figure 14:
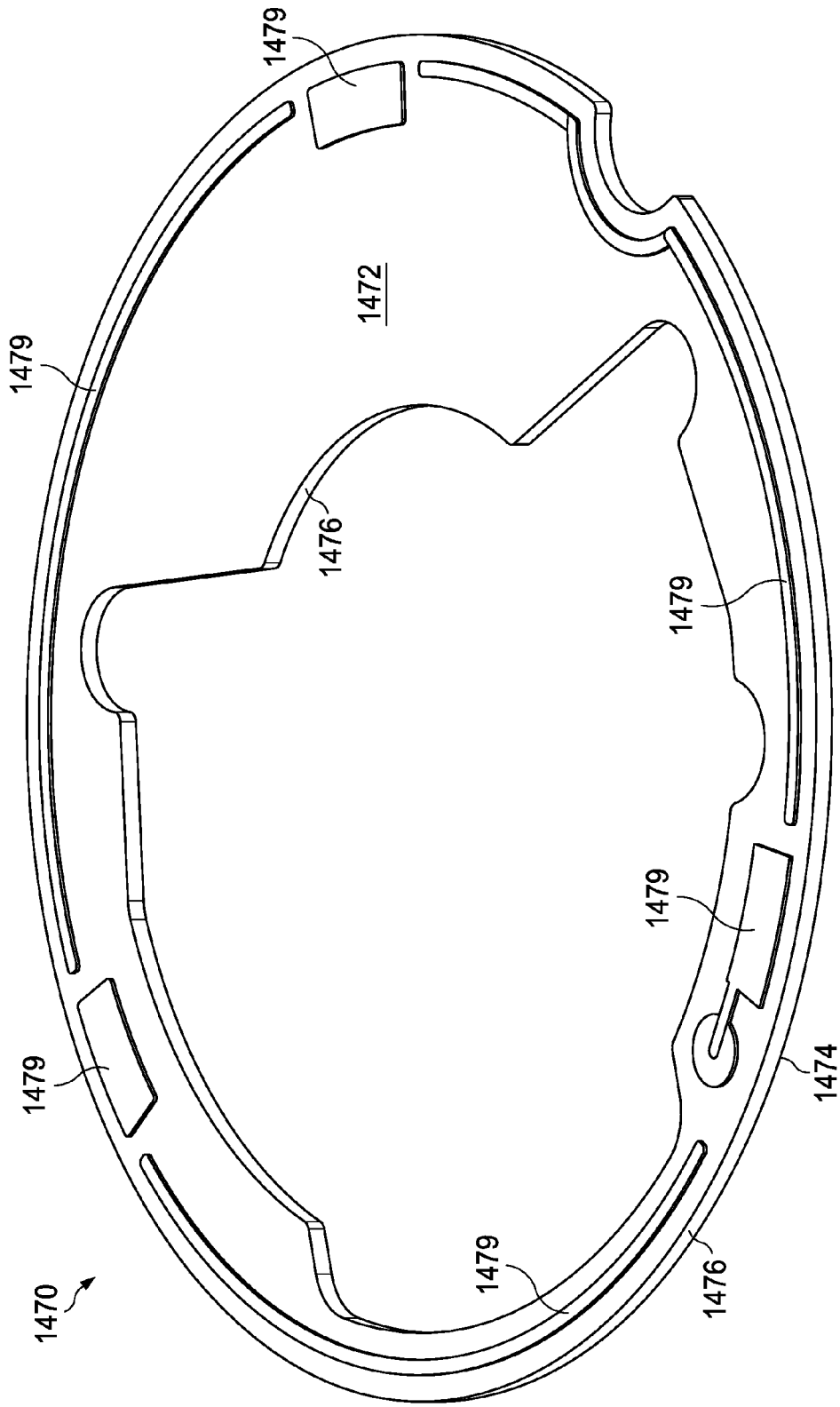
FIG. 14 is a perspective view of a spacer for use within a battery including an on-cell indicator according to one or more embodiments shown and described herein.

Referring to FIG. 14, a spacer (1470) is shown. The spacer includes a top surface (1472), a bottom surface (1474), and a side surface (1476). The top surface (1472) of the spacer (1470) includes the at least one spacer printed circuit board contact (1479).

Figure 15:
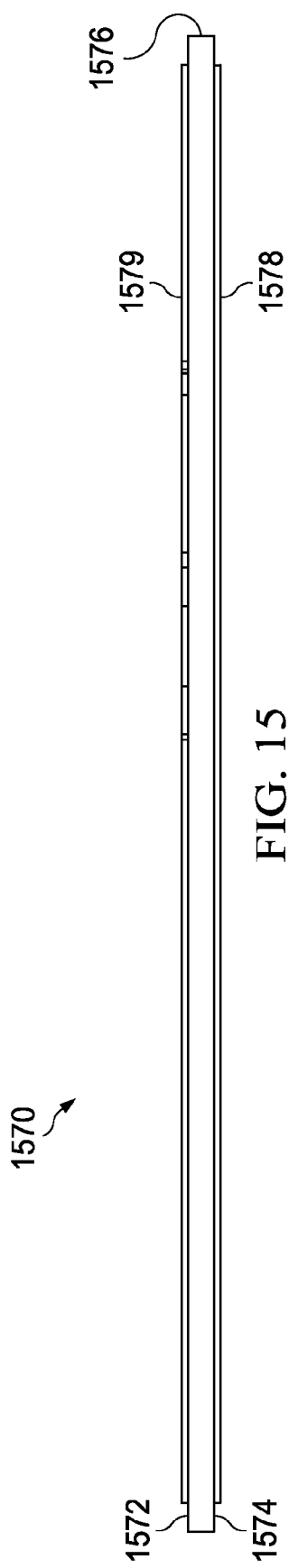
FIG. 15 is a side view of the spacer of FIG. 14.

Referring to FIG. 15, another view of the spacer (1570) of FIG. 14 is shown. The top surface (1572) of the spacer (1570) includes the least one spacer printed circuit board contact (1579). The bottom surface (1574) of the spacer (1570) includes the at least one spacer electrochemical cell contact (1578).

Figure 16:
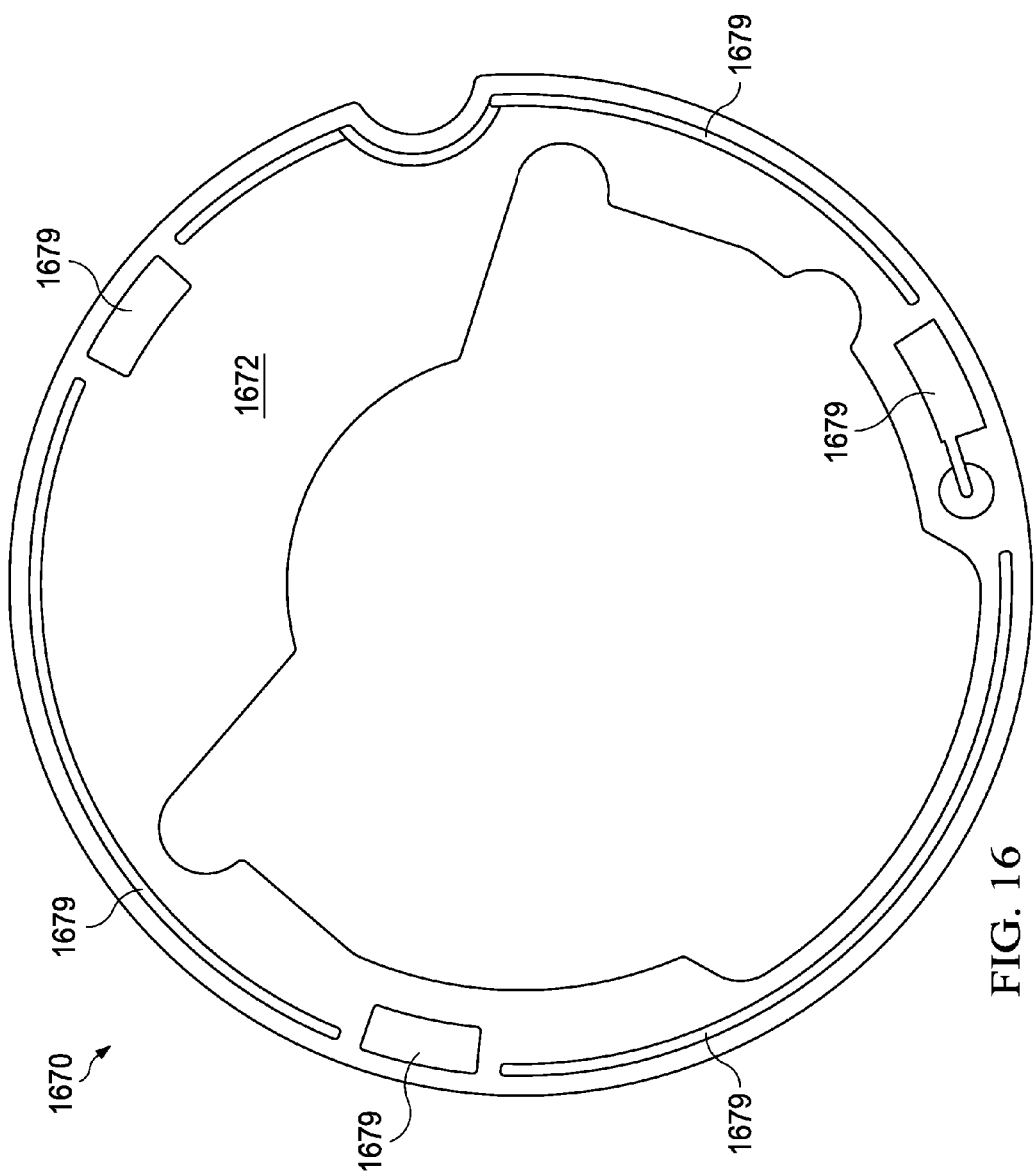
FIG. 16 is a top view of the spacer of FIGS. 14 and 15.

Referring to FIG. 16, another view of the spacer (1670) of FIGS. 14 and 15 is shown. The top surface (1672) of the spacer (1670) includes the at least one spacer printed circuit board contact (1679).

Figure 17:
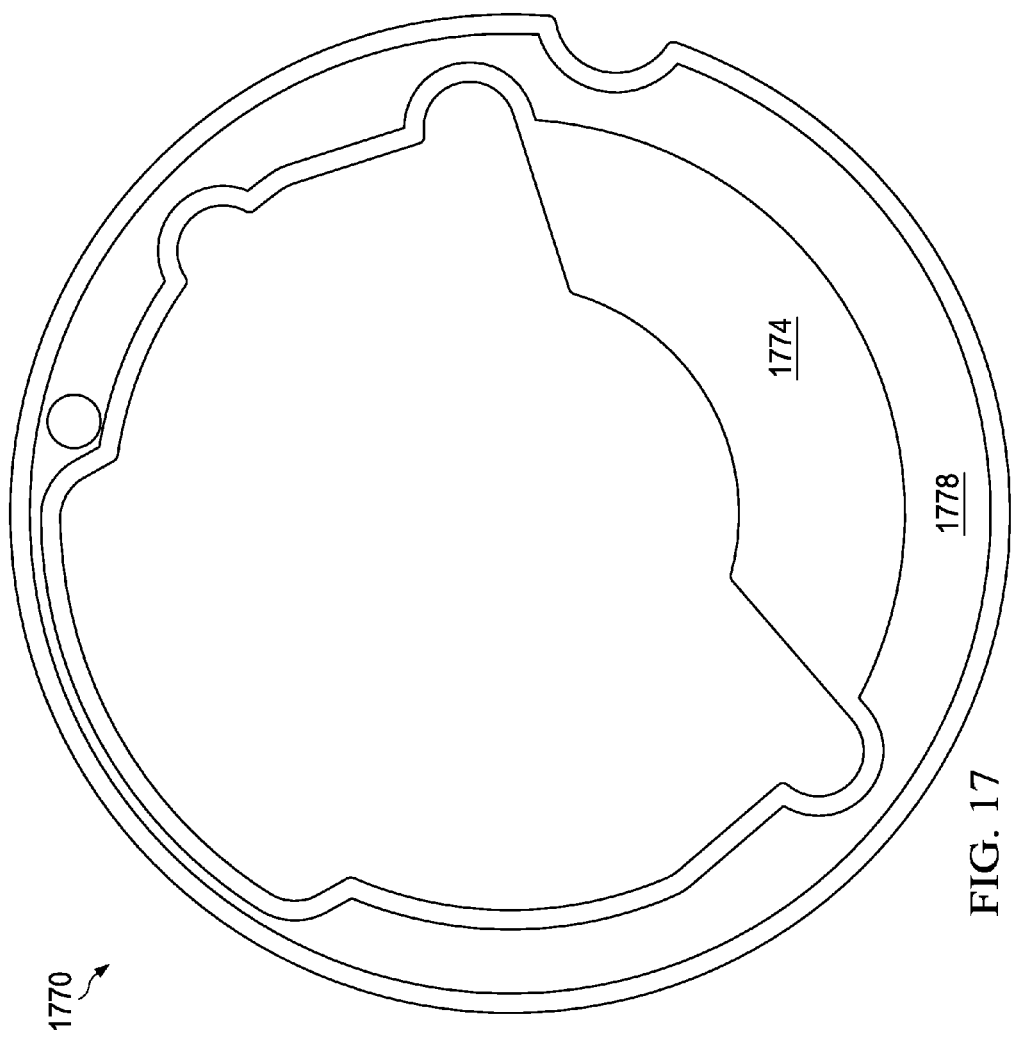
FIG. 17 is a bottom view of the spacer of FIGS. 14, 15, and 16.

Referring to FIG. 17, another view of the spacer (1770) of FIGS. 14, 15, and 16 is shown. The bottom surface (1774) of the spacer (1770) includes the at least one spacer electrochemical cell contact (1778).

Figure 18:
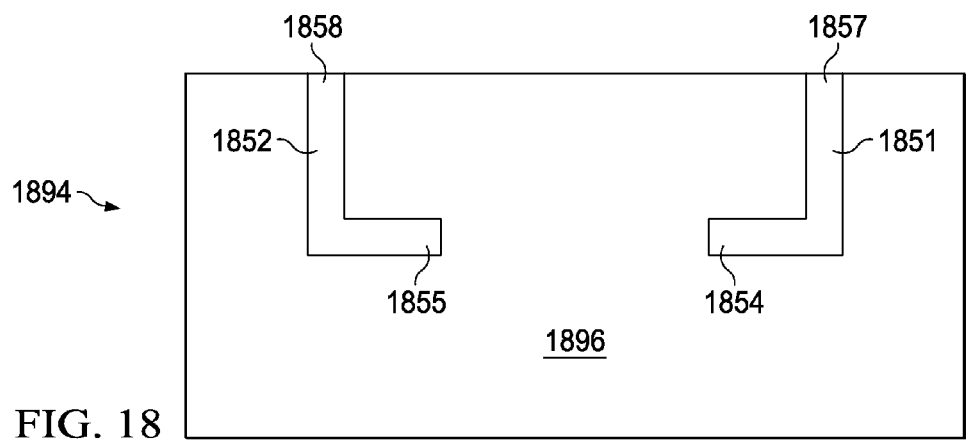
FIG. 18 is a view of a label for use with a battery including an on-cell indicator according to one or more embodiments shown and described herein.

Referring to FIG. 18, a label (1894) is shown. The label (1894) includes an inner surface (1896). The inner surface (1896) of the label (1894) may be in contact with, for example, the housing of a battery. The inner surface (1896) of the label (1894) includes a first conductive trace (1851) and a second conductive trace (1852). The first conductive trace (1851) includes a first printed circuit board interconnect (1857) and a first on-cell indicator interconnect (1854). The second conductive trace (1852) includes a second printed circuit board interconnect (1858) and a second on-cell indicator interconnect (1855).

Figure 19:
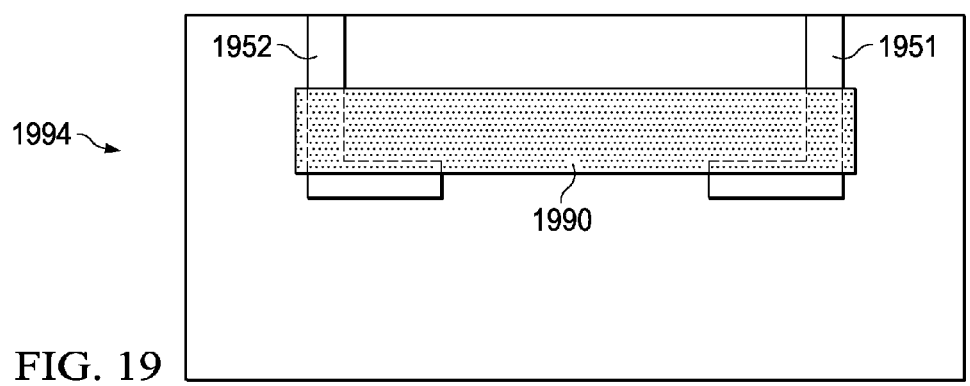
FIG. 19 is a view of a label for use with a battery including an on-cell indicator according to one or more embodiments shown and described herein.

Referring to FIG. 19, the label (1994) of FIG. 18 is shown including an insulator (1990). The insulator (1990) on the first conductive trace (1951) and the second conductive trace (1952)

Figure 20:
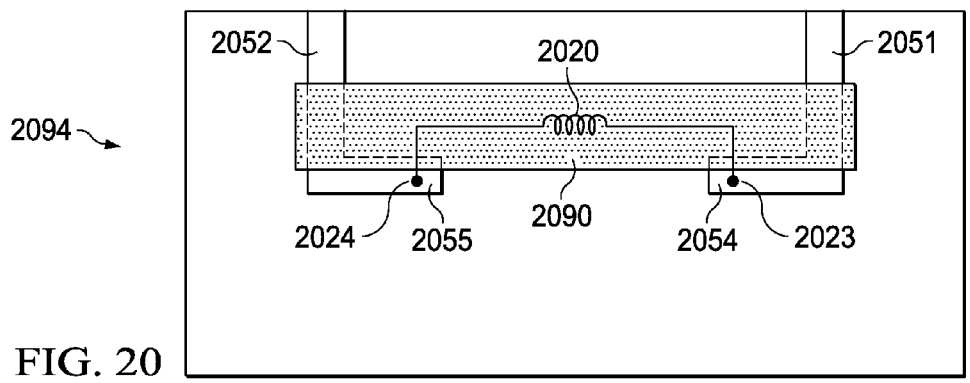
FIG. 20 is a view of a label for use with a battery including an on-cell indicator according to one or more embodiments shown and described herein.

Referring to FIG. 20, the label (2094) of FIGS. 18 and 19 is shown including an on-cell indicator (2020). The on-cell indicator (2020) is an antenna. The antenna (2020) includes at least one antenna trace. The antenna includes a first on-cell indictor terminal (2023) and a second on-cell indicator terminal (2024). The first on-cell indicator interconnect (2054) is in electrical connection with the first on-cell indicator terminal (2023). The second on-cell indicator interconnect (2055) is in electrical connection with the second on-cell indicator terminal (2024). The insulator (2090) is located between the antenna trace and the first conductive trace (2051) and the second conductive trace (2052).

As used herein, the term "interconnect" refers to a structure associated with one element that is configured to provide a direct electrical connection between the element and another element, for example, the on-cell indicator interconnect. As used herein, the terms "electrical contact," "electrical connection," "electrical coupling," and any permutations thereof should not be limited to direct, or immediate electrical connections only. That is, such terms should not be limited to those connections where one recited element directly contacts or touches another recited element. The term "direct electrical connection" and any permutation thereof, on the other hand, should be interpreted as requiring the above-mentioned direct, or immediate, contact between the two recited elements. For example, the phrase "direct electrical connection between an element A and an element B" means that there is no intermediate element C between the elements A and B (excluding, however, soldering alloy, electro-conductive glue, and the like materials that may be used to effectuate a secure direct electrical connection), while the phrase "electrical connection (or coupling) (or contact) between an element A and an element B" should mean that there may or may not be one or more intermediate electrically-conductive elements between the elements A and B.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A battery including an on-cell indicator comprising:
at least one electrochemical cell, the at least one electrochemical cell including a first terminal and a second terminal;
at least one on-cell indicator; the at least one on-cell indicator comprising at least one on-cell indicator terminal and an antenna;
a printed circuit board, the printed circuit board comprising at least one on-cell indicator terminal contact and at least one electrochemical cell contact;
the at least one electrochemical cell contact in electrical connection with the first terminal of the at least one electrochemical cell;
at least one conductive trace, the at least one conductive trace comprising an on-cell indicator interconnect and a printed circuit board interconnect, the at least one conductive trace is positioned adjacent to the antenna;
an insulator positioned between the at least one conductive trace and the antenna;
the on-cell indicator interconnect in electrical connection with the at least one on-cell indicator terminal;
the printed circuit board interconnect in electrical connection with the at least one on-cell indicator terminal contact; and
at least one integrated circuit, the at least one integrated circuit in electrical connection with the printed circuit board.

2. The battery including an on-cell indicator of claim 1, the printed circuit board comprising at least one spacer, the at least one spacer in electrical connection with the printed circuit board and the at least one electrochemical cell.

3. The battery including an on-cell indicator of claim 1 comprising a first electrochemical cell contact and a second electrochemical cell contact; the first electrochemical cell contact and the second electrochemical cell contact on a bottom surface of the printed circuit board; the first electrochemical cell contact in electrical connection with the first terminal of the at least one electrochemical cell; and the second electrochemical cell contact in electrical connection with the second terminal of the at least one electrochemical cell.

4. The battery including an on-cell indicator of claim 1 comprising a first electrochemical cell contact and a second electrochemical cell contact; the first electrochemical cell contact on a bottom surface of the printed circuit board; the second electrochemical cell contact on a top surface of printed circuit board; the first electrochemical cell contact in electrical connection with the first terminal of the at least one electrochemical cell; and the second electrochemical cell contact in electrical connection with the second terminal of the at least one electrochemical cell.

5. The battery including an on-cell indicator of claim 1 comprising a first electrochemical cell contact and a second electrochemical cell contact; the first electrochemical cell contact on a bottom surface and a top surface of the printed circuit board; the second electrochemical cell contact on the bottom surface and the top surface of the printed circuit board; the first electrochemical cell contact in electrical connection with the first terminal of the at least one electrochemical cell; and the second electrochemical cell contact in electrical connection with the second terminal of the at least one electrochemical cell.

6. The battery including an on-cell indicator of claim 1 comprising a first electrochemical cell contact and a second electrochemical cell contact; the first electrochemical cell contact on a bottom surface and a top surface of the printed circuit board; the second electrochemical cell contact on the bottom surface of the printed circuit board; the first electrochemical cell contact in electrical connection with the first terminal of the at least one electrochemical cell; and the second electrochemical cell contact in electrical connection with the second terminal of the at least one electrochemical cell.

7. The battery including an on-cell indicator of claim 1 comprising a first electrochemical cell contact and a second electrochemical cell contact; the first electrochemical cell contact on a bottom surface and a top surface of the printed circuit board; the second electrochemical cell contact on the top surface of the printed circuit board; the first electrochemical cell contact in electrical connection with the first terminal of the at least one electrochemical cell; and the second electrochemical cell contact in electrical connection with the second terminal of the at least one electrochemical cell.

8. The battery including an on-cell indicator of claim 1, wherein the at least one integrated circuit is positioned on a bottom surface of the printed circuit board.

9. The battery including an on-cell indicator of claim 1, wherein the at least one integrated circuit is positioned within the printed circuit board.

10. The battery including an on-cell indicator of claim 1, wherein the at least one on-cell indicator terminal contact is positioned on a bottom surface of the printed circuit board or a top surface of the printed circuit board.

11. The battery including an on-cell indicator of claim 1, wherein at least one tab interconnect is in electrical connection with the at least one electrochemical cell contact of the printed circuit board.

12. The battery including an on-cell indicator of claim 1, the insulator comprising a dielectric.

13. The battery including an on-cell indicator of claim 1 further comprising a communications circuit, the communications circuit comprising radio-frequency identification circuitry; near field communication circuitry; Bluetooth circuitry; Bluetooth Low Energy circuitry; Wi-Fi circuitry; Zigbee circuitry; LoRaWan circuitry; Z-wave circuitry; and any combination thereof.

14. The battery including an on-cell indicator of claim 1 further comprising a magnetic diverter.

15. The battery including an on-cell indicator of claim 1, the at least one integrated circuit comprising a memory.

16. A remote battery indication system, the system comprising:
    at least one reader; and
    at least one battery including an on-cell indicator of claim 1.

17. The remote battery indication system of claim 16, the at least one battery including an on-cell indicator comprising a magnetic diverter.

* * * * *